(12) United States Patent
Mukai et al.

(10) Patent No.: US 10,381,225 B2
(45) Date of Patent: Aug. 13, 2019

(54) SEMICONDUCTOR DEVICE HAVING IGBT AND DIODE WITH FIELD STOP LAYER FORMED OF HYDROGEN DONOR AND HELIUM

(71) Applicant: FUJI ELECTRIC CO., LTD., Kawasaki-shi, Kanagawa (JP)

(72) Inventors: Kouji Mukai, Minami-Alps (JP); Souichi Yoshida, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/694,116

(22) Filed: Sep. 1, 2017

(65) Prior Publication Data

US 2018/0012762 A1 Jan. 11, 2018

Related U.S. Application Data

(63) Continuation of application No. PCT/JP2016/073368, filed on Aug. 8, 2016.

(30) Foreign Application Priority Data

Sep. 16, 2015 (JP) .................. 2015-183481

(51) Int. Cl.
- *H01L 27/06* (2006.01)
- *H01L 21/22* (2006.01)

(Continued)

(52) U.S. Cl.
CPC .......... *H01L 21/221* (2013.01); *H01L 21/265* (2013.01); *H01L 21/324* (2013.01);

(Continued)

(58) Field of Classification Search
CPC .................. H01L 21/221; H01L 27/0664
See application file for complete search history.

(56) References Cited

U.S. PATENT DOCUMENTS

2012/0043582 A1* 2/2012 Koyama ............... H01L 21/263
257/140
2013/0075783 A1 3/2013 Yamazaki et al.
(Continued)

FOREIGN PATENT DOCUMENTS

JP H08-102545 A 4/1996
JP H10-74959 A 3/1998
(Continued)

*Primary Examiner* — Daniel Whalen
(74) *Attorney, Agent, or Firm* — Rabin & Berdo, P.C.

(57) ABSTRACT

Plural sessions of proton irradiation are performed by differing ranges from a substrate rear surface side. After first to fourth n-type layers of differing depths are formed, the protons are activated. Next, helium is irradiated to a position deeper than the ranges of the proton irradiation from the substrate rear surface, introducing lattice defects. When the amount of lattice defects is adjusted by heat treatment, protons not activated in a fourth n-type layer are diffused, forming a fifth n-type layer contacting an anode side of the fourth n-type layer and having a carrier concentration distribution that decreases toward the anode side by a more gradual slope than that of the fourth n-type layer. The fifth n-type layer that includes protons and helium and the first to fourth n-type layers that include protons constitute an n-type FS layer. Thus, a semiconductor device having improved reliability and lower cost may be provided.

14 Claims, 22 Drawing Sheets

(51) Int. Cl.
*H01L 21/265* (2006.01)
*H01L 21/324* (2006.01)
*H01L 29/06* (2006.01)
*H01L 29/08* (2006.01)
*H01L 29/32* (2006.01)
*H01L 29/739* (2006.01)
*H01L 29/861* (2006.01)
*H01L 29/36* (2006.01)
*H01L 29/66* (2006.01)
*H01L 27/07* (2006.01)
*H01L 21/322* (2006.01)

(52) U.S. Cl.
CPC ...... *H01L 27/0664* (2013.01); *H01L 27/0727* (2013.01); *H01L 29/0638* (2013.01); *H01L 29/0834* (2013.01); *H01L 29/32* (2013.01); *H01L 29/36* (2013.01); *H01L 29/66136* (2013.01); *H01L 29/7397* (2013.01); *H01L 29/8613* (2013.01); *H01L 21/26506* (2013.01); *H01L 21/3221* (2013.01)

(56) References Cited

U.S. PATENT DOCUMENTS

| | | |
|---|---|---|
| 2013/0249058 A1 | 9/2013 | Neidhart et al. |
| 2014/0246755 A1 | 9/2014 | Yoshimura et al. |
| 2014/0306283 A1 | 10/2014 | Nakajima |
| 2015/0206758 A1 | 7/2015 | Kato et al. |
| 2016/0329323 A1* | 11/2016 | Iwasaki .................. H01L 29/32 |

FOREIGN PATENT DOCUMENTS

| | | |
|---|---|---|
| JP | 2011-238872 A | 11/2011 |
| JP | 2012-043891 A | 3/2012 |
| JP | 2013-074181 A | 4/2013 |
| JP | 2014-209507 A | 11/2014 |
| JP | 2015-138801 A | 7/2015 |
| WO | WO-2013/100155 A1 | 7/2013 |

* cited by examiner

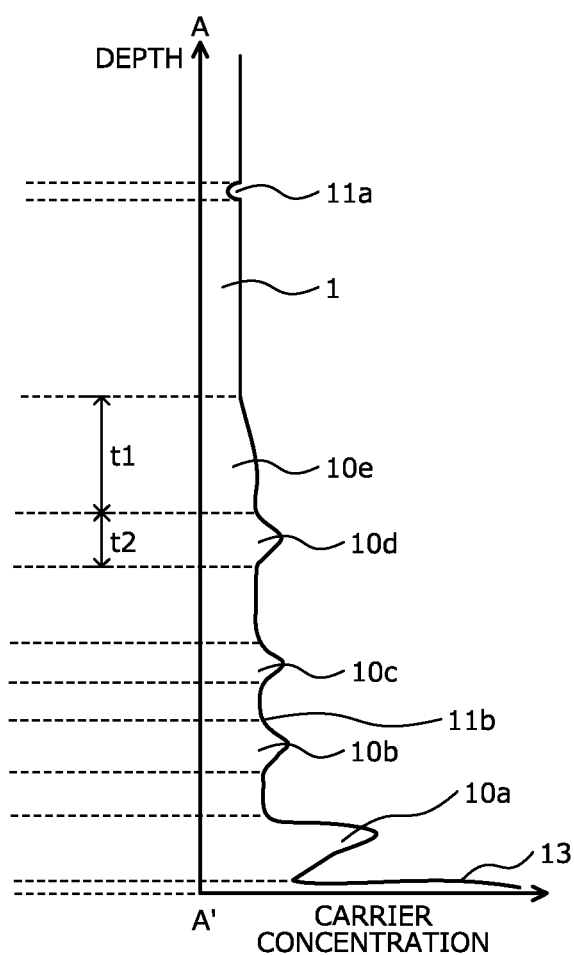

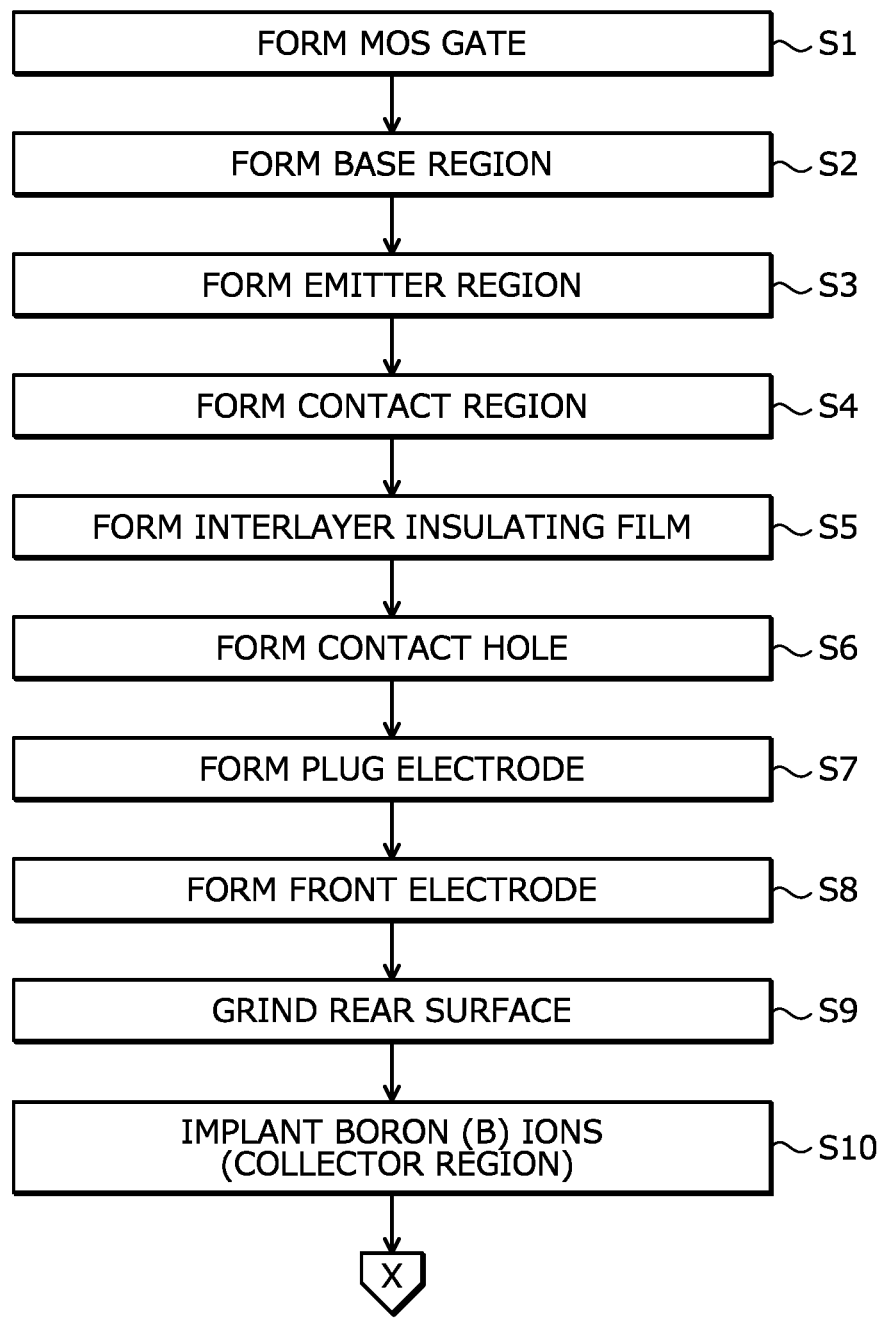

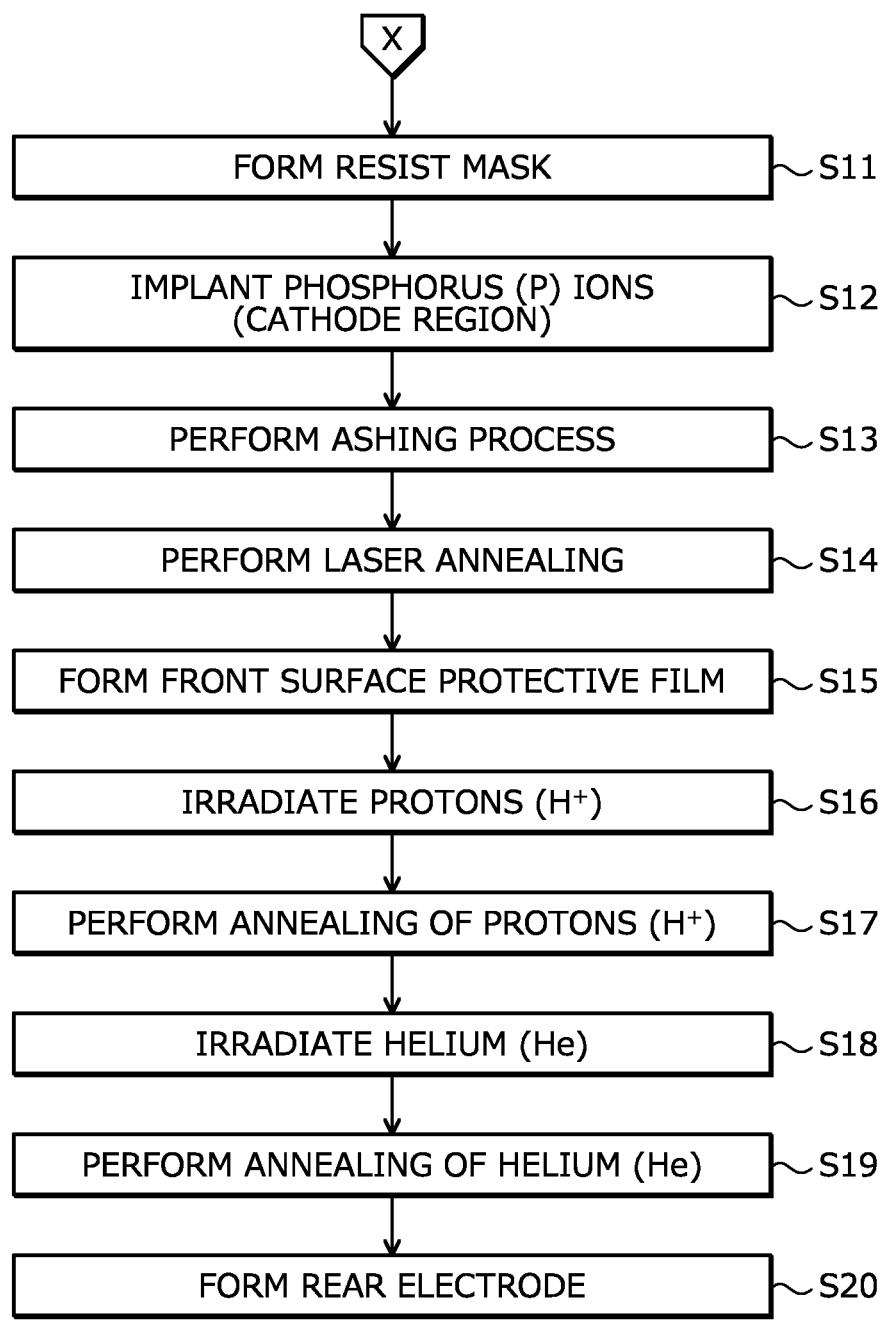

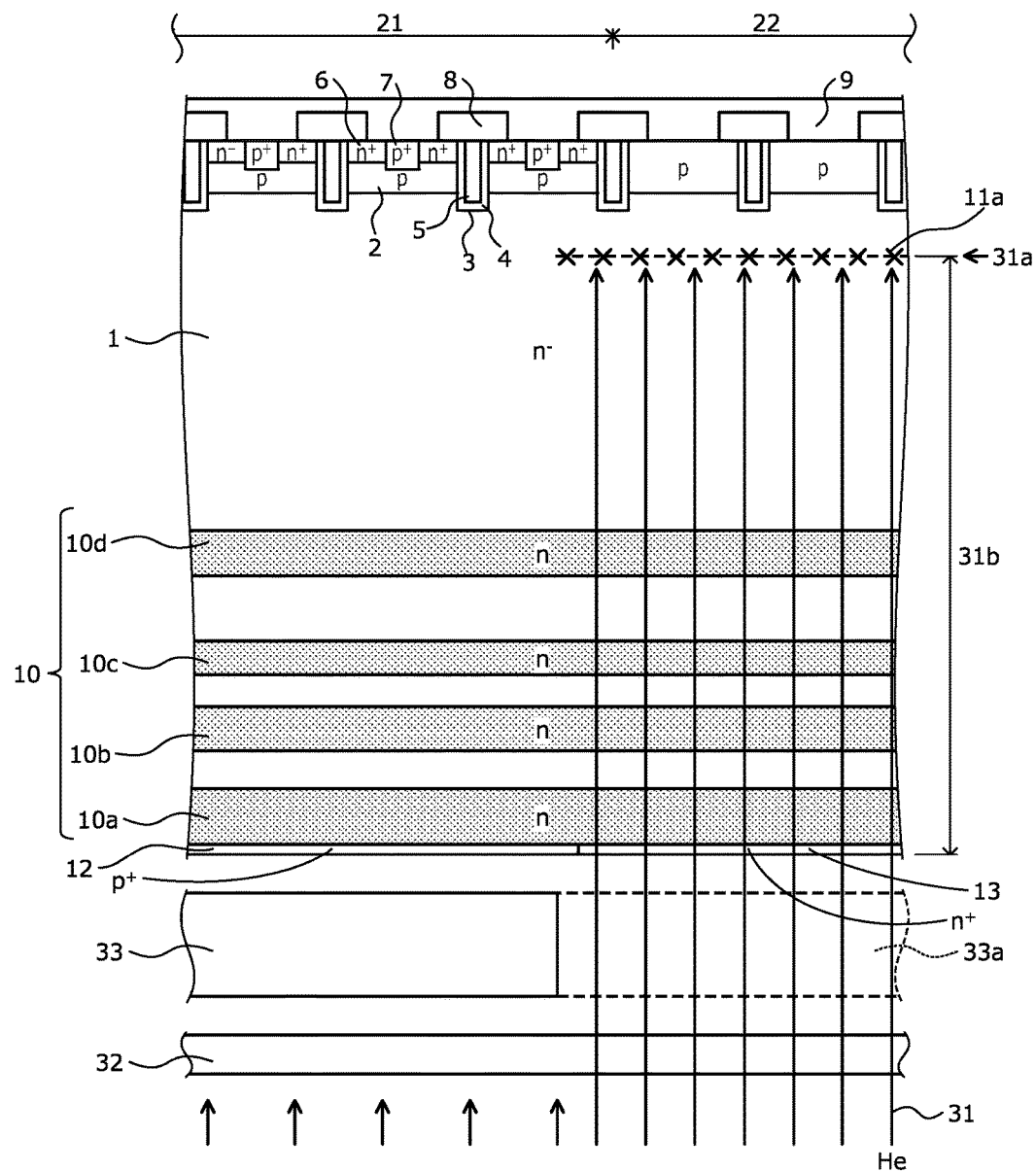

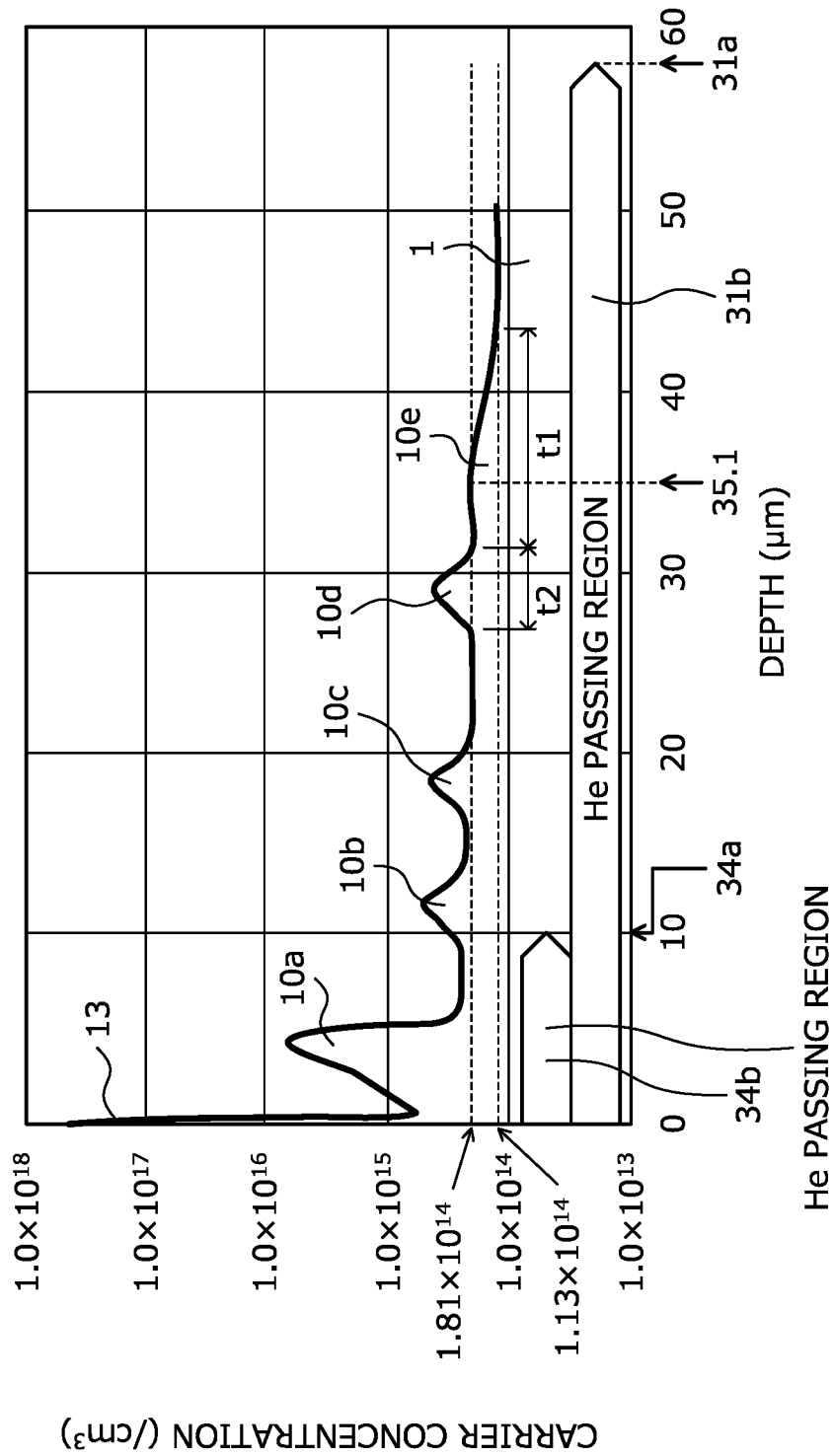

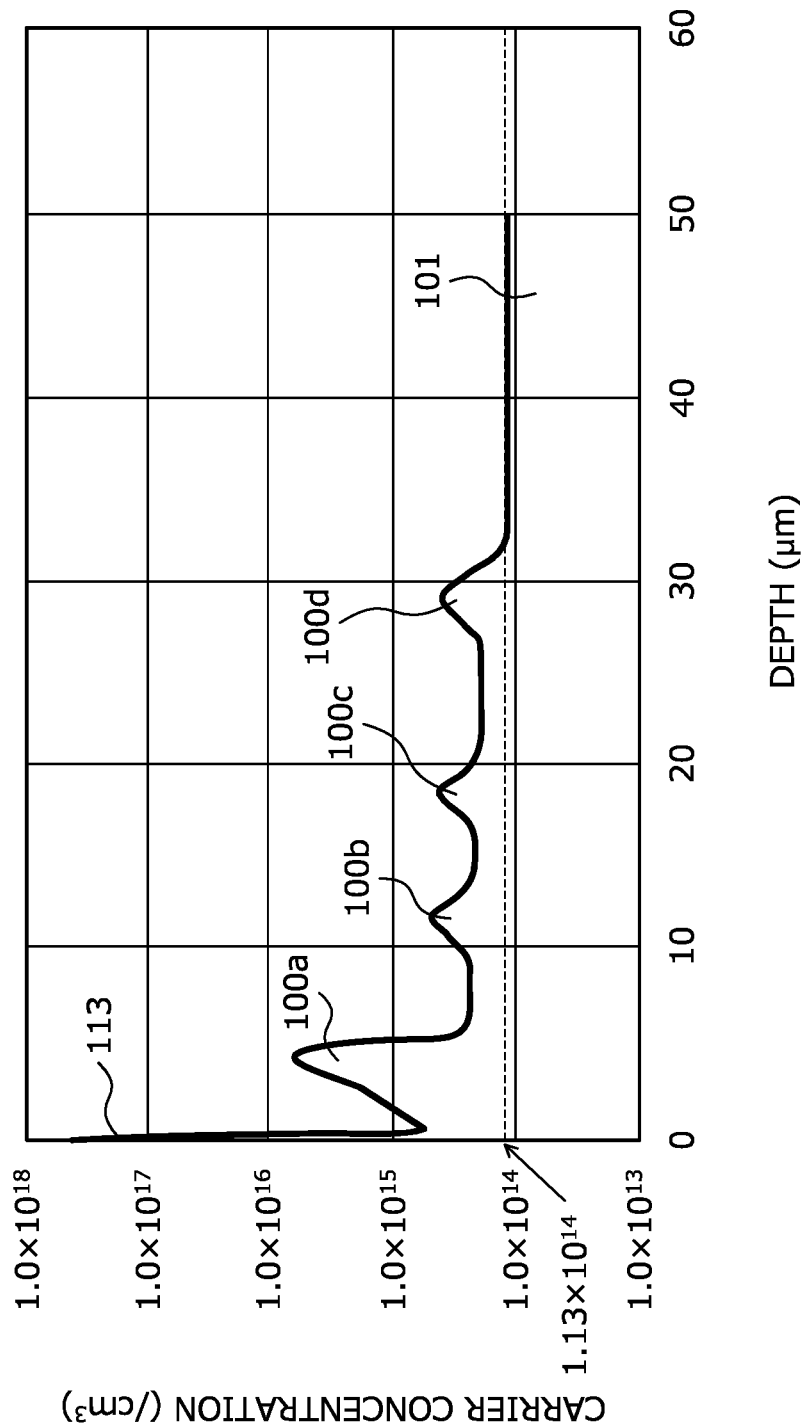

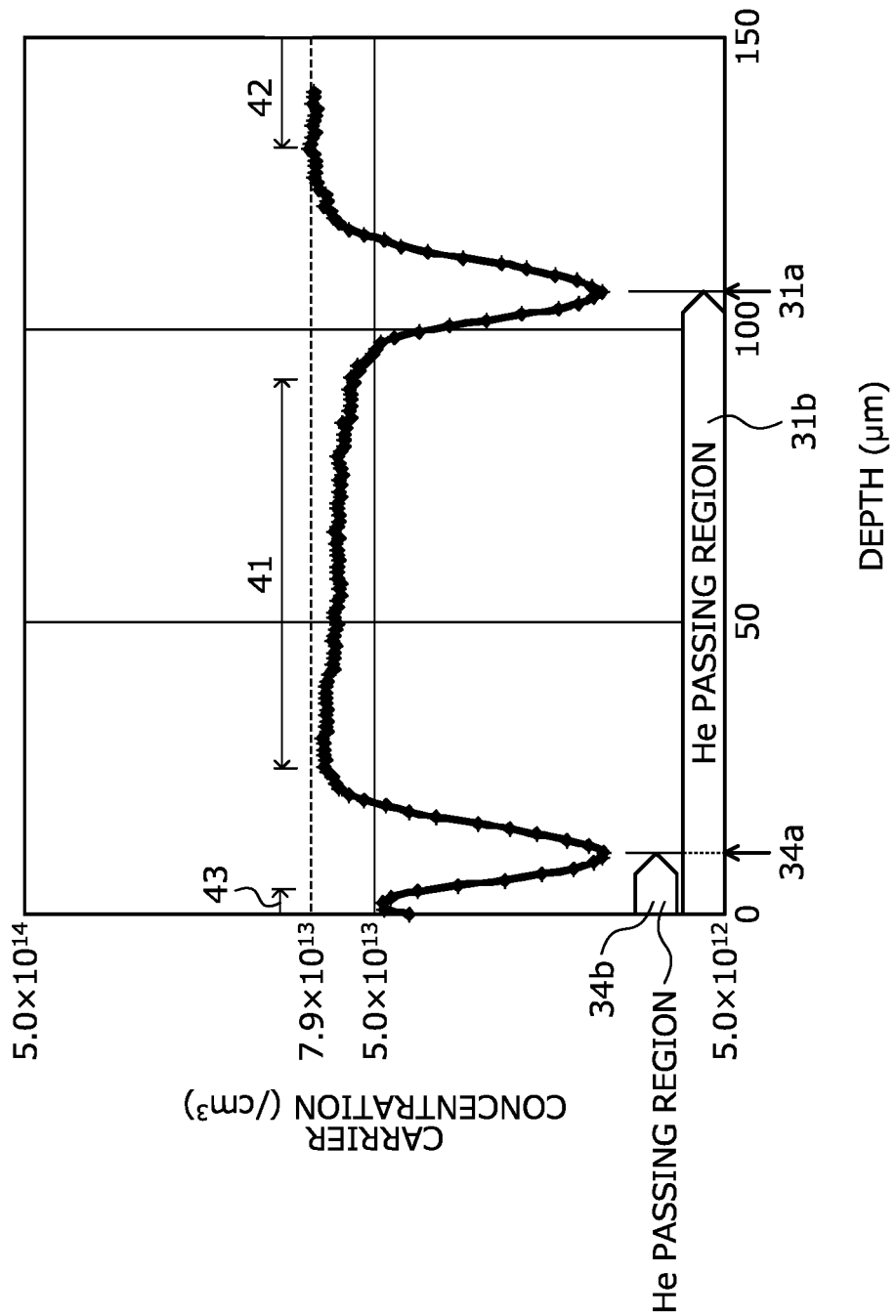

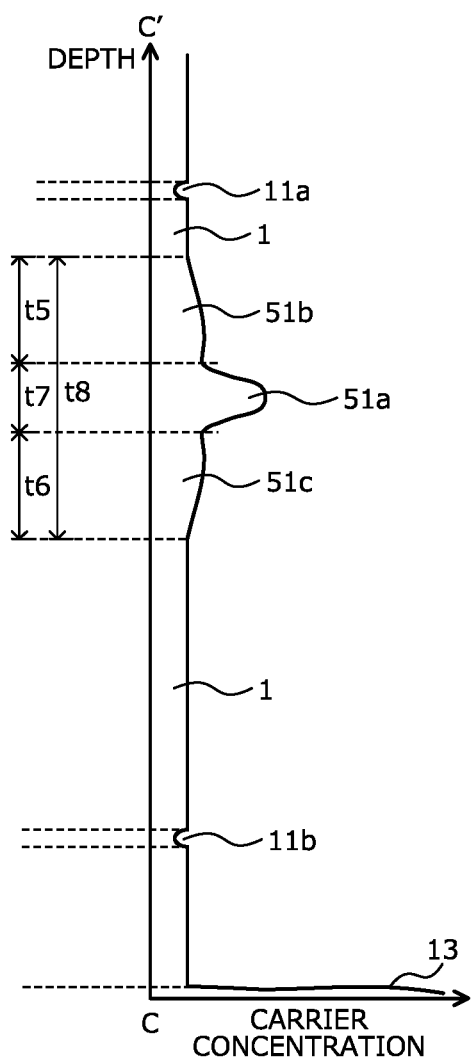

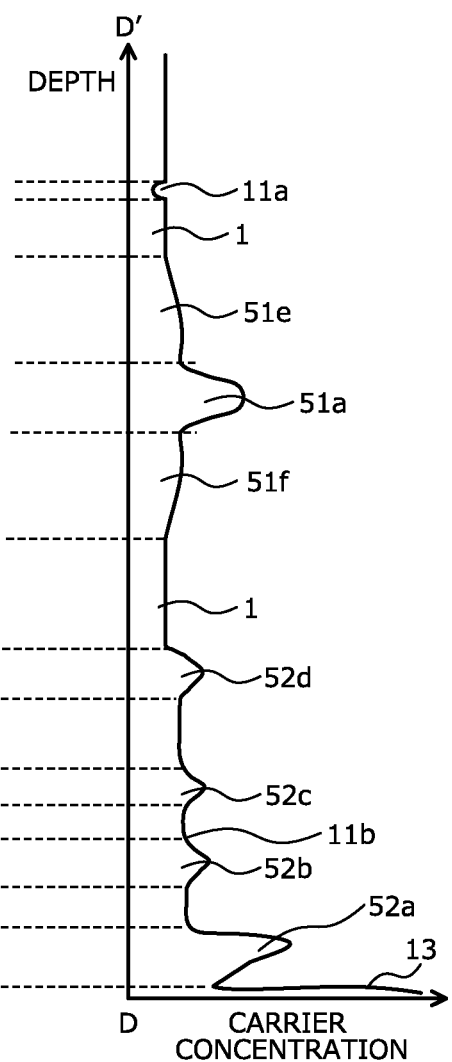

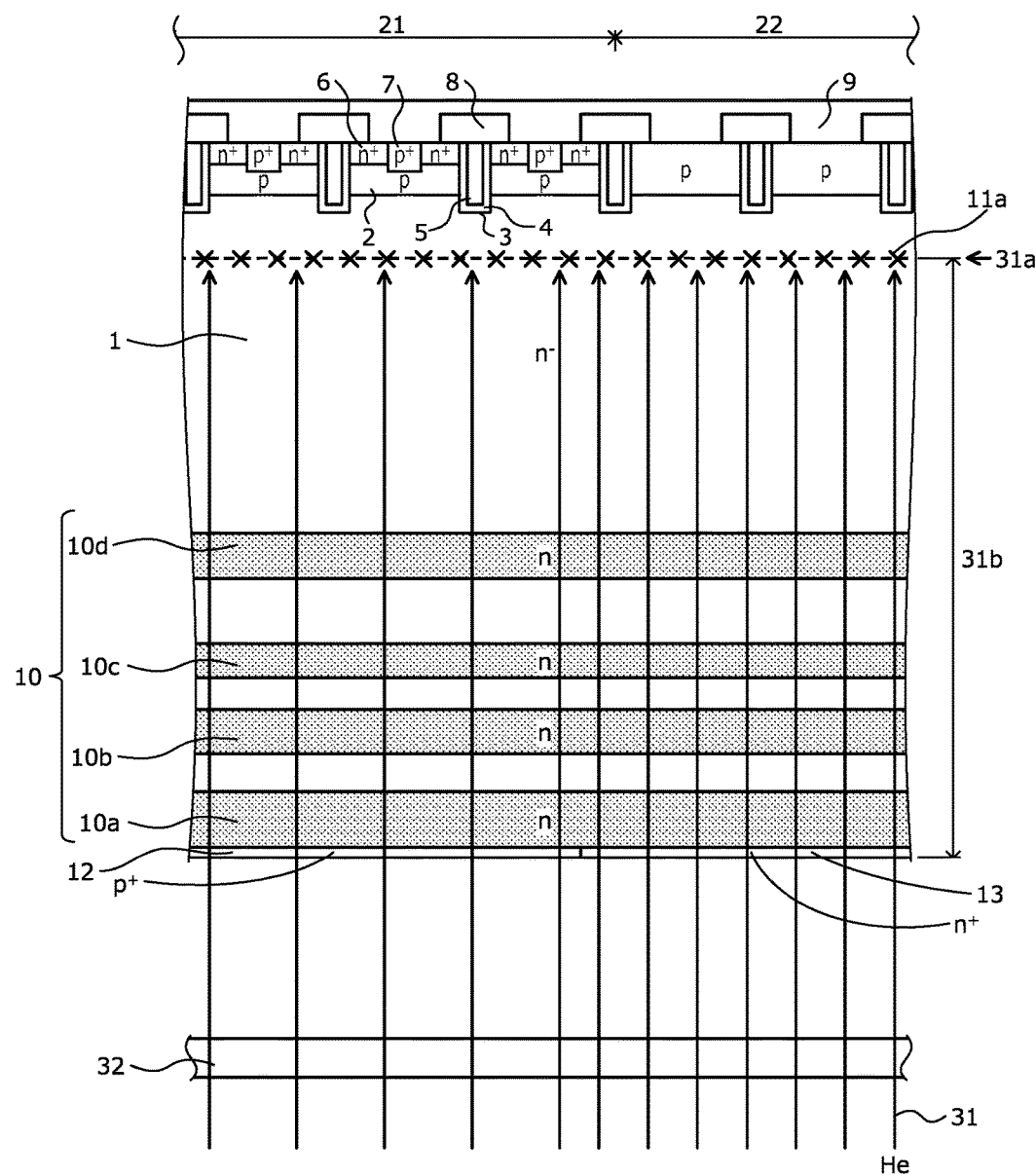

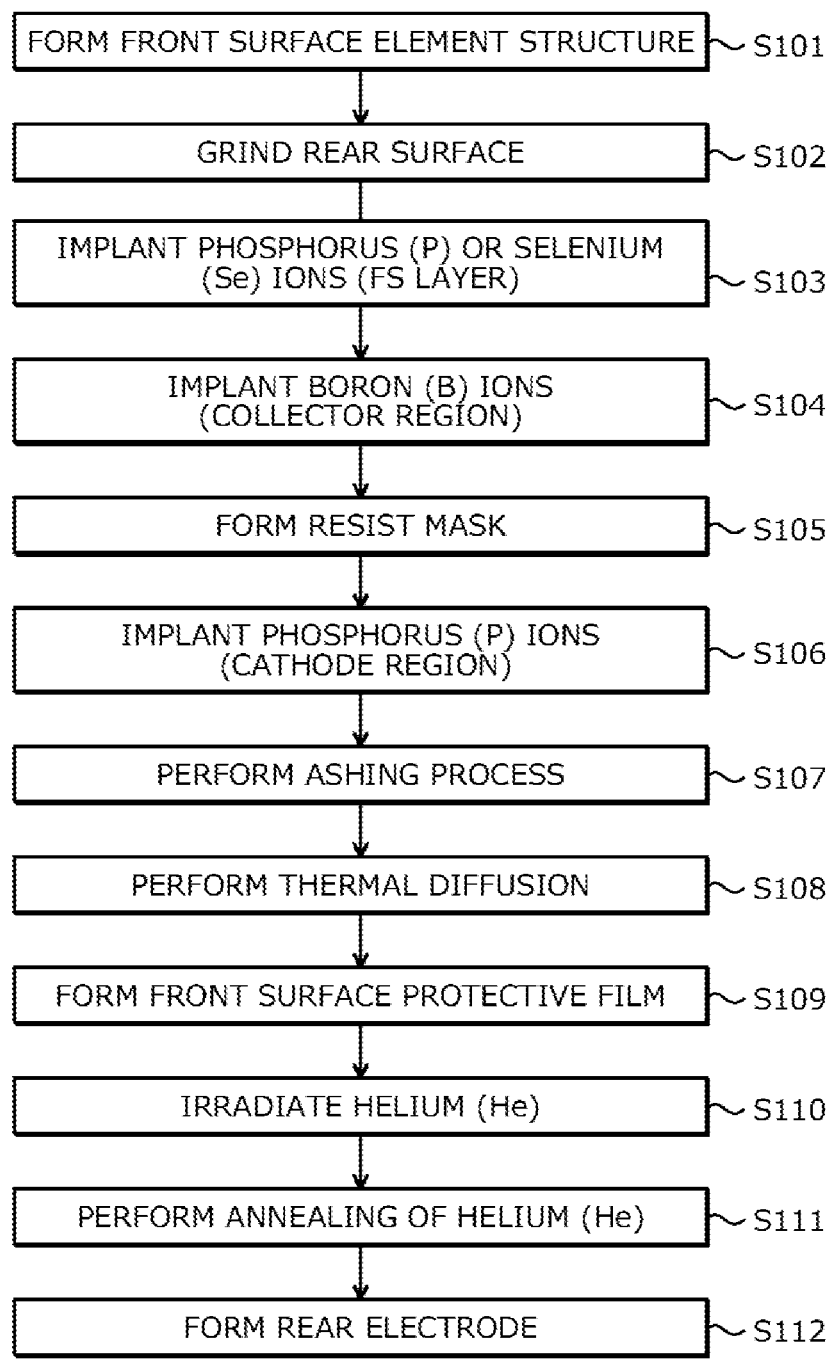

SEMICONDUCTOR DEVICE HAVING IGBT AND DIODE WITH FIELD STOP LAYER FORMED OF HYDROGEN DONOR AND HELIUM

CROSS REFERENCE TO RELATED APPLICATIONS

This is a continuation application of International Application PCT/JP2016/073368 filed on Aug. 8, 2016 which claims priority from a Japanese Patent Application No. 2015-183481 filed on Sep. 16, 2015, the contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Reverse conducting insulated gate bipolar transistors (RC-IGBTs) in which an IGBT and free wheeling diodes (FWDs) connected in antiparallel to the IGBT are integrated on a single substrate are commonly known. In power semiconductor devices such as RC-IGBTs, control of the carrier lifetime of an $n^-$-type drift layer, formation of an n-type field stop (FS) layer in the $n^-$-type drift layer, and the like are ordinarily performed.

A method of manufacturing a conventional FS-type RC-IGBT is described. FIG. 16 is a flowchart of an overview of a method of manufacturing a conventional FS-type RC-IGBT. First, on a front surface side of a semiconductor wafer of a generally adopted thickness, front-surface element structures such as an insulated gate including a metal oxide film semiconductor (MOS gate), an interlayer insulating film, and a front electrode (electrode pad) are formed by an ordinary method (step S101). Next, from a rear surface side, the semiconductor wafer is ground to a product thickness used for a semiconductor device (step S102). Next, from the ground rear surface of the semiconductor wafer, phosphorus (P) or selenium (Se) ions are implanted, forming an n-type FS layer in a rear surface layer on a rear surface of the semiconductor wafer, in an IGBT region and a diode region (step S103).

Next, boron (B) ions are implanted from the rear surface of the semiconductor wafer, forming a $p^+$-type collector region at a position in the rear surface layer of the semiconductor wafer shallower than the n-type FS layer, in the IGBT region and the diode region (step S104). Next, a resist mask having an open portion corresponding to the diode region is formed by photolithography on the rear side of the semiconductor wafer (step S105). Phosphorus ions are implanted from the rear surface of the semiconductor wafer using the resist mask as a mask to invert, in the diode region, the $p^+$-type collector region in the rear surface layer of the semiconductor wafer to an n-type and thereby form an $n^+$-type cathode region (step S106). Next, the resist mask is removed by an ashing process (step S107).

Next, the ion implanted impurities in the semiconductor wafer are diffused by heat treatment (step S108). Next, a polyimide surface protective film is formed on a front surface of the semiconductor wafer (step S109). Next, the semiconductor wafer is irradiated with helium (He) or an electron beam, introducing in the $n^-$-type drift layer, lattice defects (crystal defects) that become lifetime killers (step S110). Next, recovery of the lattice defects resulting from helium or an electron beam by heat treatment (annealing) is performed to adjust the amount of lattice defects in the semiconductor wafer. As a result, the carrier lifetime is adjusted (step S111). Next, a rear electrode contacting the $p^+$-type collector region and the $n^+$-type cathode region is formed on the rear surface of the semiconductor wafer (step S112). Thereafter, the semiconductor wafer is cut (diced) into individual chips whereby the conventional RC-IGBT is complete.

As a method of controlling RC-IGBT carrier lifetime, a method of controlling the carrier lifetime near an $n^-n^+$ junction and the carrier lifetime near a pn junction in an $n^-$-type layer on the diode side by irradiating protons ($H^+$) from both main surfaces has been proposed (e.g., refer to Japanese Laid-Open Patent Publication No. H08-102545 (paragraphs 0007, 0014, FIG. 1)). In Japanese Laid-Open Patent Publication No. H08-102545, the $n^-n^+$ junction and the pn junction in the $n^-$-type layer are each irradiated with protons from the closer main surface. Further, control of the carrier lifetime near the $n^-n^+$ junction and near the pn junction in the $n^-$-type layer by double irradiation of protons and an electron beam has been proposed.

Further, another method has been proposed in which a diode region on a substrate rear surface is covered by a He ion beam mask, helium is implanted in an IGBT region and thereafter, an active region of the IGBT region on the substrate rear surface is covered by a He ion beam mask and helium is implanted in an outer edge portion of the IGBT region and the diode region to control the carrier lifetime (e.g., refer to Japanese Laid-Open Patent Publication No. 2012-043891 (paragraphs 0053, 0056 to 0057, FIGS. 4, 5)). In Japanese Laid-Open Patent Publication No. 2012-043891, a range of the helium is adjusted by the He ion beam mask, forming a low lifetime region in the entire collector layer of the IGBT region and the entire cathode layer, an FS layer, and a drift layer of the diode region.

A further method has been proposed to control the carrier lifetime of a RC-IGBT. According to the method, in both an IGBT region and a diode region, a first low lifetime region is formed at a position slightly deeper than a trench gate of a MOS gate region and a p-type anode layer on a front surface; and a second low lifetime region is formed at a position slightly deeper in the substrate from a p-type collector layer and an n-type cathode layer on a rear surface (e.g., refer to Japanese Laid-Open Patent Publication No. 2011-238872, paragraphs 0026, 0035 to 0040, FIG. 6, etc.). In Japanese Laid-Open Patent Publication No. 2011-238872, the first low lifetime region is irradiated with helium (He) from a surface or the rear surface and the second low lifetime region is irradiated with helium (He) from the rear surface, forming each of the regions so that a crystal defect density peaks at a predetermined depth. Japanese Laid-Open Patent Publication No. 2011-238872 further describes that when the second low lifetime region is further provided in the diode region, the switching speed of the IGBT region may be further improved.

Another method has been proposed to control the carrier lifetime of a diode. According to the method, a first low carrier lifetime region is formed in an $n^+$-type cathode layer by particle beam irradiation such as proton irradiation or helium irradiation, and a second low carrier lifetime region is formed in an $n^-$-type cathode layer of a p-type anode layer by particle beam irradiation such as proton irradiation (e.g., refer to Japanese Laid-Open Patent Publication No. H10-

074959, paragraphs 0047 to 0052, FIG. 4, etc.). Japanese Laid-Open Patent Publication No. H10-074959 further describes that the particle beam irradiation may be performed from either surface of the semiconductor substrate.

SUMMARY OF THE INVENTION

According to one aspect of the present invention a method of manufacturing a semiconductor device includes irradiating protons from a first main surface of a semiconductor substrate of a first conductivity type using a first predetermined depth as a range, forming a first semiconductor layer of the first conductivity type, the first semiconductor layer containing the protons and having a peak carrier concentration at the first predetermined depth; performing a first heat treatment activating the protons; irradiating helium from the first main surface of the semiconductor substrate using a second predetermined depth that is deeper than the first predetermined depth as the range, introducing lattice defects in the semiconductor substrate; and performing a second heat treatment adjusting an amount of the lattice defects in the semiconductor substrate second heat treatment process. The second heat treatment includes forming a second semiconductor layer of the first conductivity type farther on a second main surface side of the semiconductor substrate than the first semiconductor layer, the second semiconductor layer containing protons and helium and contacting the first semiconductor layer.

In one embodiment, the second heat treatment includes forming the second semiconductor layer having a peak carrier concentration that is lower than that of the first semiconductor layer and having a carrier concentration distribution decreasing toward the second main surface side of the semiconductor substrate, by a more gradual slope than that of the first semiconductor layer.

In one embodiment, the method includes forming a second-conductivity-type semiconductor region on the second main surface side of the semiconductor substrate before irradiating the protons. The first semiconductor layer and the second semiconductor layer are formed as a field stop layer suppressing a spreading of a depletion layer that spreads from a pn junction between the second-conductivity-type semiconductor region and the semiconductor substrate to the first main surface side of the semiconductor substrate.

In one embodiment, irradiating the protons is performed for plural sessions of differing ranges, forming plural first semiconductor layers of differing depths from the first main surface of the semiconductor substrate. Of the plural first semiconductor layers, the first semiconductor layer formed at a position deepest from the first main surface of the semiconductor substrate is formed by irradiating the protons using the first predetermined depth as the range.

In one embodiment, the second heat treatment includes forming a third semiconductor layer of the first conductivity type farther on the first main surface side of the semiconductor substrate than the first semiconductor layer, the third semiconductor layer contacting the first semiconductor layer and containing the protons and the helium.

In one embodiment, the second heat treatment includes forming the third semiconductor layer having a peak carrier concentration lower than that of the first semiconductor layer and a carrier concentration distribution decreasing toward the first main surface side of the semiconductor substrate by a more gradual slope than that of the first semiconductor layer.

According to another aspect of the present invention, a semiconductor device includes a first semiconductor layer of a first conductivity type provided in a semiconductor substrate of the first conductivity type, the first semiconductor layer containing a hydrogen donor and having a peak carrier concentration at a first predetermined depth from a first main surface of the semiconductor substrate; and a second semiconductor layer of the first conductivity type provided farther on a second main surface side of the semiconductor substrate than the first semiconductor layer, the second semiconductor layer contacting the first semiconductor layer and containing the hydrogen donor and helium. A carrier lifetime on the first main surface side is longer than that on a second main surface side of the semiconductor substrate.

In one embodiment, the second semiconductor layer has a peak carrier concentration lower than that of the first semiconductor layer and a carrier concentration distribution that decreases toward the second main surface side of the semiconductor substrate by a more gradual slope than that of the first semiconductor layer.

In one embodiment, the semiconductor device includes a second-conductivity-type semiconductor region provided on the second main surface side of the semiconductor substrate. The first semiconductor layer and the second semiconductor layer constitute a field stop layer that suppresses a spreading of a depletion layer that spreads from a pn junction between the second-conductivity-type semiconductor region and the semiconductor substrate to the first main surface side of the semiconductor substrate.

In one embodiment, the semiconductor device includes plural first semiconductor layers at differing depths from the first main surface of the semiconductor substrate. Of the plural first semiconductor layers, the first semiconductor layer provided at a position deepest from the first main surface of the semiconductor substrate has a peak carrier concentration at the first predetermined depth.

In one embodiment, the semiconductor device includes a third semiconductor layer of the first conductivity type provided farther on the first main surface side of the semiconductor substrate than the first semiconductor layer, the third semiconductor layer contacting the first semiconductor layer and containing the hydrogen donor and the helium.

In one embodiment, the third semiconductor layer has a peak carrier concentration lower than that of the first semiconductor layer and a carrier concentration distribution decreasing toward the first main surface side of the semiconductor substrate by a more gradual slope than that of the first semiconductor layer.

In one embodiment, the semiconductor device includes a defect layer constituted by lattice defects of the helium included at a second predetermined depth deeper than the first predetermined depth from the first main surface of the semiconductor substrate.

In one embodiment, a carrier concentration of the semiconductor substrate is lower at a portion where the defect layer is provided than at other portions.

Other objects, features, and advantages of the present invention are specifically set forth in or will become apparent from the following detailed description of the invention when read in conjunction with the accompanying drawings.

BRIEF DESCRIPTION OF THE DRAWINGS

FIG. 1B is a diagram of carrier concentration distribution in a depth direction from a substrate rear surface along cutting line A-A' indicated in FIG. 1A;

FIGS. 2A and 2B are flowcharts of an overview of a method of manufacturing the semiconductor device according to the first embodiment;

FIGS. 3 and 4 are cross-sectional views of the semiconductor device according to the first embodiment during manufacture;

FIG. 5 is a characteristics diagram of carrier concentration distribution of a FS layer of a semiconductor device according to a first example;

FIG. 6 is a characteristics diagram of carrier concentration distribution of a FS layer of a semiconductor device for comparison (comparison example);

FIG. 7 is a characteristics diagram of carrier concentration distribution due to helium irradiation;

FIG. 9B is a diagram depicting carrier concentration distribution in the depth direction from the substrate rear surface along cutting line C-C' in FIG. 9A;

FIG. 12B is a diagram depicting the carrier concentration distribution in the depth direction from the substrate rear surface along cutting line D-D' depicted in FIG. 12A;

FIGS. 13 and 14 are cross-sectional views of the semiconductor device according to the fifth embodiment during manufacture;

FIG. 16 is a flowchart of an overview of a method of manufacturing a conventional FS-type RC-IGBT.

DETAILED DESCRIPTION OF THE INVENTION

Figure 1A:
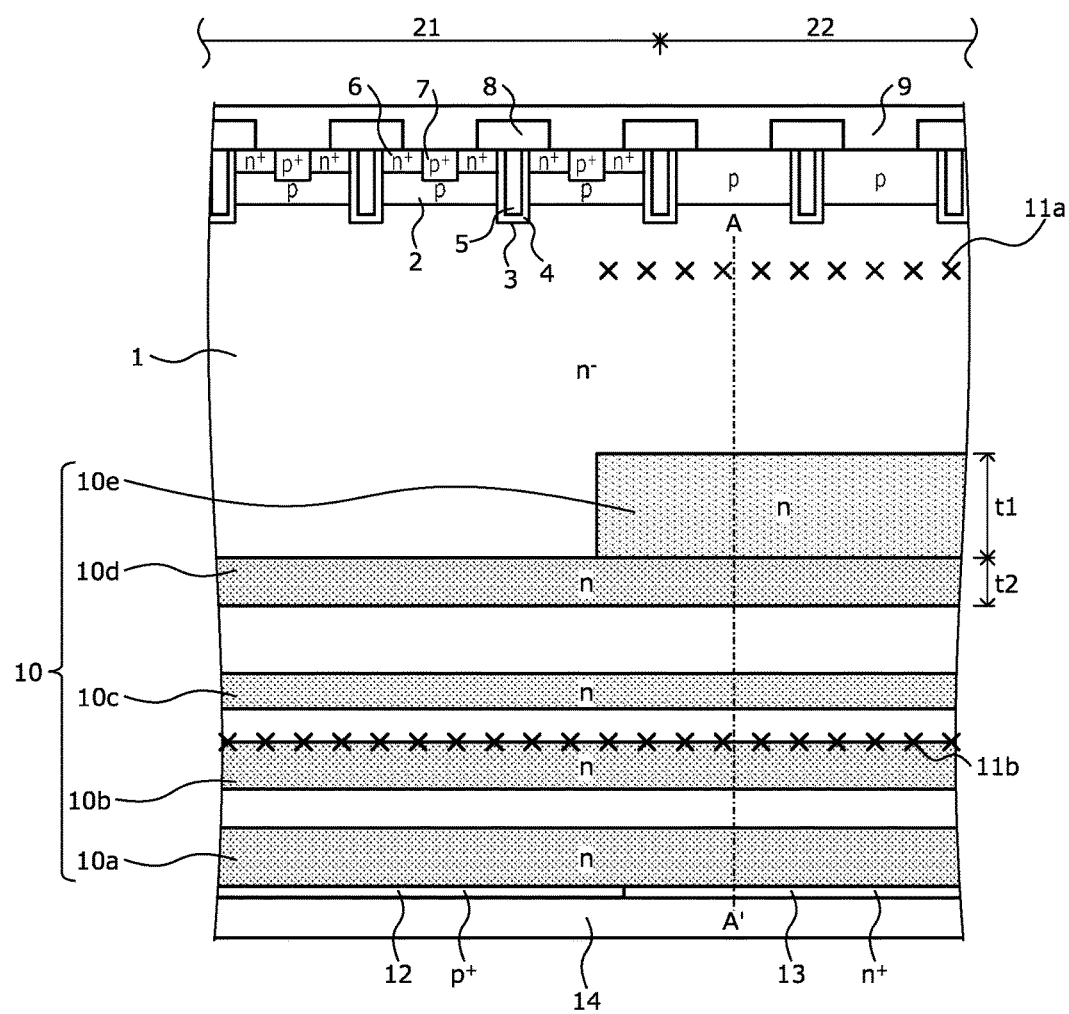
FIG. 1A is a cross-sectional view of a structure of a semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the embodiments a first conductivity type is assumed to be an n-type and a second conductivity type is assumed to be a p-type.

A structure of the semiconductor device according to a first embodiment will be described taking a RC-IGBT as an example. FIG. 1A is a cross-sectional view of a structure of the semiconductor device according to the first embodiment. FIG. 1B is a diagram of carrier concentration distribution in a depth direction from a substrate rear surface (border of semiconductor substrate and rear electrode) along cutting line A-A' indicated in FIG. 1A. The semiconductor device according to the first embodiment depicted in FIG. 1A is a RC-IGBT in which an IGBT having a trench gate structure and a diode connected in antiparallel to the IGBT are integrated on a single semiconductor substrate (semiconductor chip). In particular, on a single semiconductor substrate, an IGBT region 21 constituting an operating region of the IGBT and a diode region 22 constituting an operating region of the diode are provided in parallel.

A p-type base layer (second-conductivity-type semiconductor region) 2 is provided in a surface layer on a front surface of the semiconductor substrate constituting an n$^-$-type drift layer 1, in the IGBT region 21 and the diode region 22. The p-type base layer 2 functions as a p-type anode region in the diode region 22. A trench 3 penetrating the p-type base layer 2 and reaching the n$^-$-type drift layer 1 is provided. The trench 3 is arranged, for example, in a striped planar layout at predetermined intervals along a direction from the IGBT region 21 toward the diode region 22, thereby, separating the p-type base layer 2 into plural regions (mesa portions). In the trench 3, a gate insulating film 4 is provided along an inner wall of the trench 3 and on the gate insulating film 4, a gate electrode 5 is provided.

In the IGBT region 21, an n$^+$-type emitter region 6 and a p$^+$-type contact region 7 are each selectively provided in each mesa portion in the p-type base layer 2. The n$^+$-type emitter region 6 faces the gate electrode 5 across the gate insulating film 4 provided on the inner wall of the trench 3. In the diode region 22, the n$^+$-type emitter region 6 is not provided in the p-type base layer 2. A front electrode 9 contacts the n$^+$-type emitter regions 6 and the p$^+$-type contact regions 7 through contact holes and is electrically insulated from the gate electrode 5 by an interlayer insulating film 8. The front electrode 9 functions as an emitter electrode in the IGBT region 21 and functions as an anode electrode in the diode region 22.

An n-type field stop (FS) layer 10 is provided in the n$^-$-type drift layer 1, on a substrate rear surface side. The n-type FS layer 10 has a function of suppressing the spreading of a depletion layer that spreads from a pn junction between the p-type base layer 2 and the n$^-$-type drift layer 1 toward a p$^+$-type collector region 12, in the OFF state. The n-type FS layer 10, in the IGBT region 21 and the diode region 22, has n-type layers (first semiconductor layer) 10$a$ to 10$d$ that are levels (here, 4 levels) at differing depths from the substrate rear surface. In FIG. 1, reference characters 10$a$ to 10$d$ are appended sequentially from a first n-type layer 10$a$ nearest the substrate rear surface, along the depth direction from the substrate rear surface. The plural levels of the n-type layers (hereinafter, first to fourth n-type layers) 10$a$ to 10$d$ are diffusion layers including protons and formed by multiple sessions of proton (H$^+$) irradiation of differing ranges (projection ranges (projection lengths along angle of incidence)) Rp.

A diffusion layer including protons is a donor layer including complex defects (VOH) of a proton, i.e., hydrogen (H), a void (V) mainly formed at the time of proton irradiation, and oxygen (O) included in the semiconductor substrate. A VOH complex defect is a defect indicating a donor in silicon or a semiconductor that includes silicon, by a hydrogen-related donor or a hydrogen donor called a donor. Hereinafter, a VOH complex defect is simply referred to as a hydrogen donor.

The first to fourth n-type layers 10a to 10d each has a carrier concentration distribution in which a position (depth position of the range Rp from the substrate rear surface) reached by protons in the proton irradiation has a peak (maximum value) and from the peak position, the concentration sharply decreases toward both substrate main surfaces (anode side and cathode side). A peak carrier concentration of the first n-type layer 10a that is nearest the substrate rear surface is lower than the carrier concentration of the p$^+$-type collector region 12 and an n$^+$-type cathode region 13 described hereinafter, and is higher than peak carrier concentrations of the second to fourth n-type layers 10b to 10d. The first n-type layer 10a may contact the p$^+$-type collector region 12 and the n$^+$-type cathode region 13. Peak carrier concentrations of the first to fourth n-type layers 10a to 10d respectively decrease with increasing depth of the position of the layer from the substrate rear surface. Peak carrier concentrations of the second to fourth n-type layers 10b to 10d may be substantially about the same. The first to fourth n-type layers 10a to 10d may be formed at a predetermined depth from the substrate rear surface with favorable controllability by using protons.

Further, the n-type FS layer 10 has an n-type layer (hereinafter, a fifth n-type layer (second semiconductor layer)) 10e at a position deeper than the fourth n-type layer 10d from the substrate rear surface. The fifth n-type layer 10e is provided in the diode region 22. The fifth n-type layer 10e may extend to a vicinity of a boundary of the IGBT region 21 and the diode region 22. Further, the fifth n-type layer 10e is a diffusion layer that includes protons and helium and is formed by proton irradiation for forming the fourth n-type layer 10d and, for example, by helium (He) irradiation for controlling the carrier lifetime of the n$^-$-type drift layer 1. The fifth n-type layer 10e contacts the anode side of the fourth n-type layer 10d and has a peak carrier concentration at a portion deeper than the fourth n-type layer 10d from the substrate rear surface. Further, the fifth n-type layer 10e has a peak carrier concentration that is lower than that of the first to fourth n-type layers 10a to 10d formed by proton irradiation and has a substantially flat carrier concentration distribution having a more gradual slope from the peak position toward the anode side than those of the first to fourth n-type layers 10a to 10d. A thickness t1 of the fifth n-type layer 10e is thicker than a thickness t2 of the fourth n-type layer 10d (t1>t2). In other words, at a position deepest from the substrate rear surface, an n-type layer is arranged as the n-type FS layer 10 and has a thickness (=t1+t2) equivalent to the thicknesses of the fourth and fifth n-type layers 10d, 10e.

Further, in the diode region 22, at a position deeper than the fifth n-type layer 10e from the substrate rear surface in the n$^-$-type drift layer 1, a defect layer (hereinafter, a first defect layer) 11a formed by introduced lattice defects (indicated by "x") such as a void (V) constituting a lifetime killer and resulting from helium (He) irradiation is provided. The first defect layer 11a may extend to a vicinity of the boundary of the IGBT region 21 and the diode region 22. The carrier concentration of the n$^-$-type drift layer 1 is lower at a portion where the first defect layer 11a is provided than at other portions. Therefore, in the diode region 22, the carrier lifetime of the n$^-$-type drift layer 1 becomes shorter whereby carrier extinction at the time of reverse recovery of the diode is expedited, enabling reverse recovery loss to be reduced.

Further, the carrier concentration of the n$^-$-type drift layer 1 is lower at a portion where the first defect layer 11a is provided than the carrier concentration (ingot carrier concentration) of the semiconductor substrate; and at a portion where the n-type FS layer 10 is provided, the carrier concentration of the n$^-$-type drift layer 1 is lower than the carrier concentration of the semiconductor substrate. As a result, in the diode region 22, the carrier lifetime becomes longer on the anode side of the n$^-$-type drift layer 1 than on the cathode side thereof. Therefore, oscillation of the current/voltage waveform Irp, Vrp at the time of reverse recovery of the diode and surges (transient abnormal voltage dV/dt) due to voltage waveform Vrp oscillation are less likely to occur. Further, by providing the fifth n-type layer 10e, the n-type FS layer 10 has a carrier concentration distribution in which a width from the substrate rear surface and reaching a deep position is wider than that in a conventional case whereby softer recovery of reverse recovery current/voltage waveform Irp, Vrp than in a conventional case is obtained.

Further, a defect layer (hereinafter, a second defect layer) 11b due to helium irradiation may be formed near a boundary of the n$^-$-type drift layer 1 and the p$^+$-type collector region 12 and a boundary of the n$^-$-type drift layer 1 and the n$^+$-type cathode region 13. The carrier concentration of the n$^-$-type drift layer 1 at a portion where the second defect layer 11b is provided may be reduced and adjusted to a predetermined carrier concentration, enabling switching characteristics of the RC-IGBT to be adjusted. FIG. 1A depicts a state in which the second defect layer 11b is formed near the second n-type layer 10b. In this case, the carrier concentration near the second n-type layer 10b may be reduced and adjusted.

In the rear surface layer of the semiconductor substrate, at a position shallower than the n-type FS layer 10, the p$^+$-type collector region 12 is provided in the IGBT region 21 and the n$^+$-type cathode region 13 is provided in the diode region 22. The n$^+$-type cathode region 13 is adjacent to the p$^+$-type collector region 12. The p$^+$-type collector region 12 and the n$^+$-type cathode region 13 may contact the first n-type layer 10a farthest on the substrate rear surface side of the n-type FS layer 10. A rear electrode 14 is provided on a surface (entire rear surface of the n$^-$-type semiconductor substrate) of the p$^+$-type collector region 12 and the n$^+$-type cathode region 13. The rear electrode 14 functions as a collector electrode in the IGBT region 21 and functions as a cathode electrode in the diode region 22.

Figure 4:
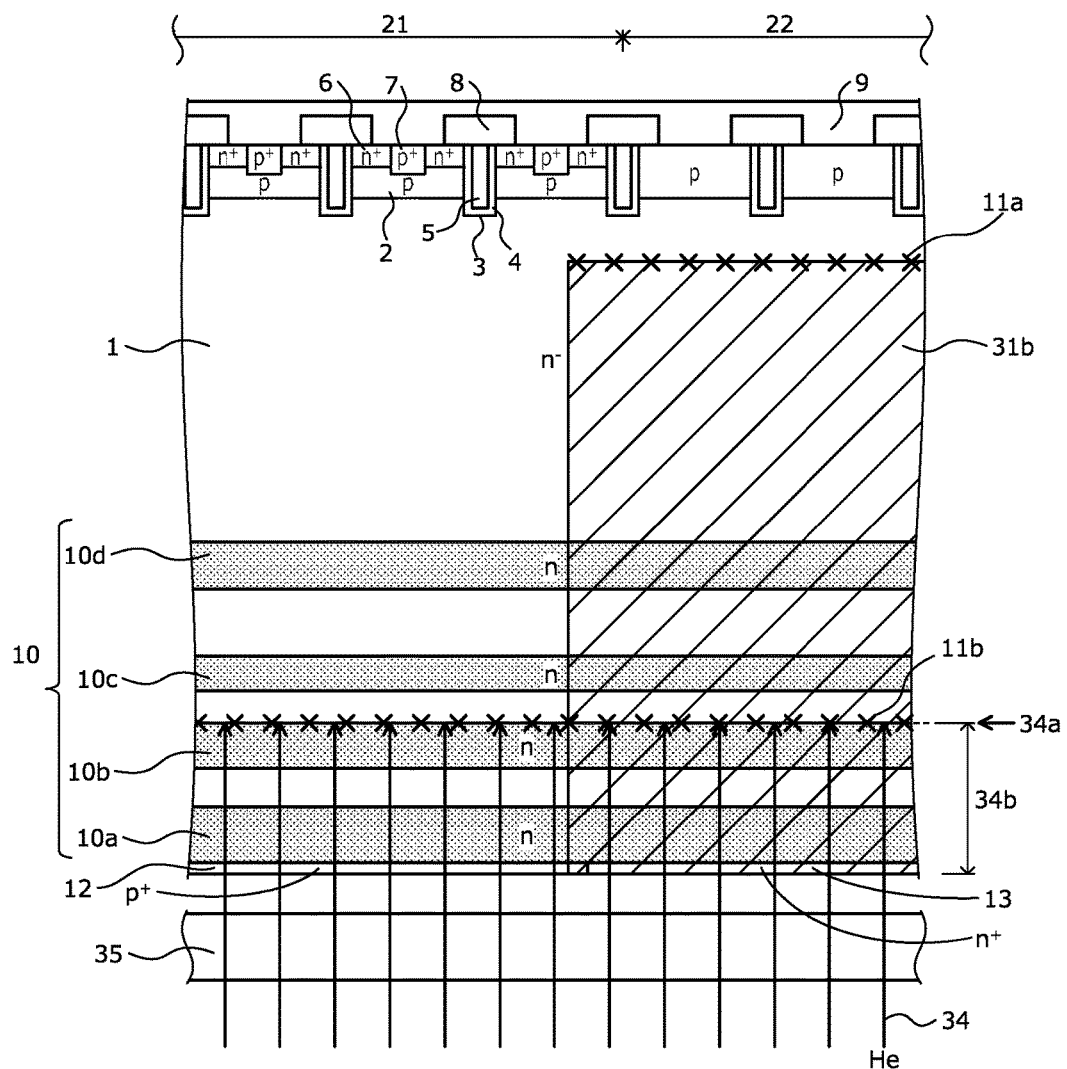

A method of manufacturing the semiconductor device according to the first embodiment is described. FIGS. 2A and 2B are flowcharts of an overview of the method of manufacturing the semiconductor device according to the first embodiment. FIGS. 3 and 4 are cross-sectional views of the semiconductor device according to the first embodiment during manufacture. First, on the front surface side of an n$^-$-type semiconductor substrate (semiconductor wafer) constituting the n$^-$-type drift layer 1, the trench 3, the gate insulating film 4, and the gate electrode 5 are formed sequentially by an ordinary method whereby a MOS gate is formed (step S1). Next, a p-type impurity such as boron (B) is ion implanted, forming the p-type base layer 2 in the surface layer of the entire substrate front surface, at a depth shallower than the trench 3 (step S2).

Next, an n-type impurity such as phosphorus (P) or arsenic (As) is ion implanted, selectively forming the n$^+$-type emitter region 6 in the p-type base layer 2 of the IGBT region 21 (step S3). Next, a p-type impurity such as boron is ion implanted, selectively forming the p$^+$-type contact region 7 in the p-type base layer 2 of the IGBT region 21 (step S4). Here, the p$^+$-type contact region 7 may be selectively formed in the p-type base layer 2 of the diode region 22. The formation sequence of the n$^+$-type emitter region 6 and the p$^+$-type contact region 7 may be interchanged. Next, the interlayer insulating film 8 constituted by, for example, a BPSG film or the like, is deposited (formed) so as to cover the gate electrode 5 (step S5).

Next, the interlayer insulating film 8 is patterned forming a contact hole and exposing the n$^+$-type emitter region 6 and the p$^+$-type contact region 7 in the IGBT region 21, and the p-type base layer 2 in the diode region 22 (step S6). Next, in the contact hole, a plug electrode (not depicted) is formed via a barrier metal (not depicted) (step S7). Next, for example, the front electrode 9 is formed on the entire surface of the interlayer insulating film 8 by a sputtering method so as to contact the plug electrode in the contact hole (step S8). Next, the semiconductor substrate is ground from the rear surface side to a product thickness used for the semiconductor device (step S9). Next, for example, a p-type impurity such as boron is ion implanted in the entire substrate rear surface, forming the p$^+$-type collector region 12 in the surface layer of the entire substrate rear surface (step S10).

Next, a resist mask having an open portion corresponding to the diode region (not depicted) is formed on the substrate rear surface by photolithography (step S11). Next, for example, an n-type impurity such as phosphorus is ion implanted using the resist mask as a mask whereby the p$^+$-type collector region 12 of the surface layer of the substrate rear surface in the diode region 22 is inverted to an n-type, forming the n$^+$-type cathode region 13 (step S12). Next, the resist mask is removed by an ashing process (step S13). Next, the p$^+$-type collector region 12 and the n$^+$-type cathode region 13 are activated by laser annealing (step S14). Next, the entire substrate front surface is covered by a surface protecting film (not depicted) such as, for example, a polyimide film and thereafter, the surface protecting film is patterned, exposing the front electrode 9 and electrode pads (step S15).

Next, from the substrate rear surface side, protons are irradiated, forming the n-type FS layer 10 (step S16). At step S16, for example, multiple sessions (e.g., 4 sessions) of proton irradiation of differing ranges Rp are performed from the substrate rear surface, forming the plural levels of the n-type layers at different depths from the substrate rear surface as the n-type FS layer 10. Here, from the substrate rear surface, the range Rp of each proton irradiation may be adjusted by directly irradiating protons at different accelerating voltages. For example, by setting the accelerating voltage of the proton irradiation to about 3 MeV, an n-type layer having a half-width of about 3 µm and a peak carrier concentration at a depth of about 60 µm from the irradiated surface is formed. Further, when the accelerating voltage of the proton irradiation is set to about 8 MeV, an n-type layer having a half-width of about 10 µm and a peak carrier concentration at a depth of about 60 µm from the irradiated surface is formed.

Further, at step S16, for example, the range Rp of each proton irradiation may be adjusted by setting the accelerating voltage to be constant and irradiating protons through absorbers of differing thicknesses. For example, when the accelerating voltage of the proton irradiation is set to be constant at about 4.3 MeV and the thickness of the absorber is about 95 µm, an n-type layer having a half-width of about 10 µm and a peak carrier concentration at a depth of about 60 µm from the irradiated surface is formed. The absorber, for example, is a member containing a material having a stopping power on the same order as that of the semiconductor substrate, such as aluminum (Al). Further, the dose of the multiple sessions of proton irradiation is decreased as the length of the range Rp from the substrate rear surface to increases.

At step S16, the dose of the proton irradiation for forming the first n-type layer 10a near the substrate rear surface may be higher than the dose of the proton irradiation for forming the second to fourth n-type layers 10b to 10d or may be substantially the same as the dose of the proton irradiation for forming the second to fourth n-type layers 10b to 10d. The formation sequence of the plural levels of the n-type layers may be variously changed. Next, protons in the semiconductor substrate are activated by heat treatment (annealing) (step S17).

Next, as depicted in FIG. 3, helium irradiation (hereinafter, a first helium irradiation) 31 is performed for which the range is set to a position that from the substrate rear surface is deeper than the position of the range Rp of the proton irradiation at step S16 whereby lattice defects that become lifetime killers are introduced in the n$^-$-type drift layer 1 in the diode region 22 to the boundary of the IGBT region 21 and the diode region 22, (step S18). For example, the range of the first helium irradiation 31 is deeper than an end of the anode side of the fourth n-type layer 10d from the substrate rear surface. Here, preferably, an absorber 32 may be used to adjust the range of the first helium irradiation 31 so that helium does not reach the MOS gate on the substrate front surface side.

Further, at step S18, a thick metal plate 33 containing a material having a stopping power on the same order as that of the semiconductor substrate, such as aluminum, for example, is arranged between the semiconductor substrate and the absorber 32 so that lattice defects are not introduced into a portion of the IGBT region 21 where lattice defects are not to be introduced. The metal plate 33, for example, is a member having a substantially circular planar shape to cover the entire substrate rear surface and has an opening 33a that exposes an irradiation region for the first helium irradiation 31 of the substrate rear surface. The first helium irradiation 31 introduces a large amount of lattice defects at a position (position at a depth of the range Rp of the first helium irradiation 31 (hereinafter, a first helium reaching point)) 31a reached by helium whereby the carrier concentration is significantly reduced. In addition, lattice defects are formed overall in a region (region from the substrate rear surface to the first helium reaching point 31a (hereinafter, the first helium passing region)) 31b through which the helium passes. In other words, the first defect layer 11a is formed at the first helium reaching point 31a. In addition, the carrier concentration of a portion away from the first helium reaching point 31a is also slightly reduced. The portion away from the helium reaching point is a portion of the helium passing region, and the substrate rear surface is closer to the portion away from the helium reaching point than a portion exhibiting concave carrier concentration distribution centered about the helium reaching point at which the carrier concentration is lowest.

Further, as depicted in FIG. 4, in the process at step S18, helium may be irradiated from the substrate rear surface (hereinafter, a second helium irradiation) 34 to introduce lattice defects near the boundary of the n$^-$-type drift layer 1 and the p$^+$-type collector region 12 and the boundary of the n$^-$-type drift layer 1 and the n$^+$-type cathode region 13 and thereby adjust switching characteristics of the RC-IGBT. Here, the range Rp of the second helium irradiation 34 is adjusted using, for example, an absorber 35. The second helium irradiation 34 further introduces a large amount of lattice defects at a position (position at the depth of the range Rp of the second helium irradiation 34 (hereinafter, a second helium reaching point)) 34a reached by helium whereby the carrier concentration is significantly reduced. In other words, the second defect layer 11b is formed at the second helium reaching point 34a. In addition, lattice defects are introduced overall in a region (region from the substrate rear surface to the second helium reaching point 34a (hereinafter, a second helium passing region)) 34b through which the helium passes whereby the carrier concentration of a portion away from the second helium reaching point 34a is slightly reduced. In FIG. 4, a portion indicated by diagonal hatching is the first helium passing region 31b of the first helium irradiation 31.

Next, recovery of the lattice defects resulting from the first and second irradiations 31, 34 is performed by heat treatment (annealing) to adjust the amount of lattice defects in the semiconductor substrate and thereby, adjust the carrier lifetime (step S19). Here, protons that have not been activated in the fourth n-type layer 10d are diffused, forming the fifth n-type layer 10e in contact with the fourth n-type layer 10d on the anode side of the fourth n-type layer 10d and having a carrier concentration distribution that decreases toward the anode side at a lower rate (having a more gradual slope) than the fourth n-type layer 10d (refer to FIG. 1).

The fifth n-type layer 10e is formed in the first helium passing region 31b and, protons and helium are present in the fifth n-type layer 10e. Further, protons that have not been activated in the first to fourth n-type layers 10a to 10d are diffused and this diffusion of protons recovers the lattice defects in the first and second helium passing regions 31b, 34b. In addition, lattice defects remain at the first and second helium reaching points 31a, 34a, maintaining the significant reduction of the carrier concentration. As a result, in the diode region 22, a carrier concentration distribution may be achieved in which the carrier lifetime is shorter on the anode side and the carrier lifetime is longer over a wide range on the cathode side.

Next, on the entire rear surface of the semiconductor substrate, the rear electrode 14 is formed contacting the p$^+$-type collector region 12 and the n$^+$-type cathode region 13 (step S20). Thereafter, the semiconductor wafer is cut (diced) into individual chips whereby the RC-IGBT having a trench gate structure and depicted in FIG. 1 is completed.

Verification of the carrier concentration distribution of the n-type FS layer 10 was performed. FIG. 5 is a characteristics diagram of the carrier concentration distribution of the FS layer of a semiconductor device according to a first example. FIG. 6 is a characteristics diagram of the carrier concentration distribution of the FS layer of a semiconductor device for comparison (comparison example). A RC-IGBT having a trench gate structure was produced (manufactured) according to the method of manufacturing a semiconductor device according to the first embodiment, using the conditions described above (hereinafter, a first example). In particular, in the first example, the RC-IGBT was produced using a silicon wafer (semiconductor substrate) cut (sliced) from an ingot produced by a magnetic field applied Czochralski (MCZ) method. Resistivity of the silicon wafer was 38 Ωcm (converted carrier concentration (carrier concentration of the ingot) was $1.13 \times 10^{14}/cm^3$) and the thickness was set to be 70 μm.

At step S16, the first to fourth n-type layers 10a to 10d were formed as the n-type FS layer 10 by 4 sessions of proton irradiation of differing accelerating voltages. In the proton irradiation for forming the first n-type layer 10a, the accelerating voltage was set to 0.40 MeV and the dose was set to $3.0 \times 10^{14}/cm^2$ so that the range Rp from the rear surface of the wafer was about 4 μm. In the proton irradiation for forming the second n-type layer 10b, the accelerating voltage was set to 0.82 MeV and the dose was set to $1.0 \times 10^{13}/cm^2$ so that the range Rp from the rear surface of the wafer was about 10 μm. In the proton irradiation for forming the third n-type layer 10c, the accelerating voltage was set to be 1.10 MeV and the dose was set to be $7.0 \times 10^{12}/cm^2$ so that the range Rp from the rear surface of the wafer was about 18 μm.

In the proton irradiation for forming the fourth n-type layer 10d, the accelerating voltage was set to be 1.45 MeV and the dose was set to be $1.0 \times 10^{13}/cm^2$ so that the range Rp from the rear surface of the wafer was about 28 μm. At step S17, annealing to activate the protons was performed at 380 degrees C. for 5 hours. At step S18, the first and second helium irradiations 31, 34 were performed. In the first helium irradiation 31, the dose was set to be $9.0 \times 10^{10}/cm^2$ and the range Rp from the rear surface of the wafer was adjusted by an absorber to be about 58 μm. In the second helium irradiation 34, the dose was set to be $5.0 \times 10^{10}/cm^2$ and the range Rp from the rear surface of the wafer was adjusted by an absorber to be about 10 μm. At step S19, annealing to recover the lattice defects resulting from the first and second helium irradiations 31, 34 was performed at 360 degrees C. for 1 hour.

Further, as the comparison example, a RC-IGBT having a trench gate structure was produced. The comparison example differs from the first example in that the first and second helium irradiations 31, 34 at step S18 and heat treatment at the step S19 to recover the lattice defects caused by the helium were not performed. Excluding omission of the processes at steps S18 and S19, conditions of the comparison example were the same as those for the first example. Further, the carrier concentration distribution of the first example and of the comparison example was measured by a spreading resistance (SR) measuring method. The measurement results are depicted in FIGS. 5 and 6. In FIG. 5, the first and second helium passing regions 31b, 34b of the first and second helium irradiations 31, 34 are indicated by arrows from a wafer rear surface (position at a depth of 0 μm) reaching the first and second helium reaching points 31a, 34a (similarly in FIG. 7).

As depicted in FIG. 6, in the comparison example, only 4 layers including n-type layers 100a to 100d were formed as the n-type FS layer and the carrier concentration of a portion that was deeper than the fourth n-type layer 100d arranged deepest from the wafer rear surface was confirmed to be the same as the carrier concentration (the carrier concentration of the n$^-$-type drift layer 101) of the silicon wafer. Reference numeral 113 is the n$^+$-type cathode region.

On the other hand, as depicted in FIG. 5, in the first example, it was confirmed that a region (the fifth n-type layer 10e) having a carrier concentration higher than the carrier concentration of the silicon wafer (the carrier concentration of the n$^-$-type drift layer 101) and having a thickness (width) t1 of 10 μm was formed at a position deeper on the anode side than the fourth n-type layer 10d arranged deepest from the wafer rear surface. The fifth n-type layer 10e was confirmed to have a peak carrier concentration at a position (a depth of 35.1 μm from the wafer rear surface) deeper than the fourth n-type layer 10d arranged at a deepest position from the wafer rear surface. Further, the peak carrier concentration of the fifth n-type layer 10e was confirmed to be $1.81 \times 10^{14}/cm^3$, which was lower than the peak carrier concentrations of the first to fourth n-type layers 10a to 10d. Further, the fifth n-type layer 10e was confirmed to have a thickness (wide width)

greater than the thickness (half width) t2 of the fourth n-type layer 10d and a carrier concentration distribution that decreases toward the anode side by a more gradual slope than the fourth n-type layer 10d.

Verification of carrier concentration variation due to the first helium irradiation 31 was confirmed. FIG. 7 is a characteristics diagram of the carrier concentration distribution due to helium irradiation. A monitor wafer (semiconductor substrate) was prepared by performing only the first and second helium irradiations 31, 34 at step S18 of the method of manufacturing a semiconductor device according to the first embodiment described above (hereinafter, a second example). In the second example, a silicon wafer (semiconductor substrate) cut from an ingot produced by a MCZ method was used as the monitor wafer. The resistivity of the silicon wafer was 54.6 Ωcm (converted carrier concentration was $7.9 \times 10^{13}/cm^3$). In the first helium irradiation 31, the dose was set to $9.0 \times 10^{10}/cm^2$ and the range Rp from the wafer rear surface was adjusted by an absorber to be about 110 μm. In the second helium irradiation 34, the dose was set to be $1.1 \times 10^{11}/cm^2$ and the range Rp from the wafer rear surface was adjusted by an absorber to be about 10 μm. In both the first and second helium irradiations 31, 34, helium 3 ($^3$He) was used to form the first and second defect layers 11a, 11b each having a half width of 7 μm. The annealing at step S19 was not performed. The carrier concentration distribution near a center of the wafer was measured by a SR method and the results are depicted in FIG. 7.

From the results depicted in FIG. 7, it was confirmed that the carrier concentration significantly decreases at the first helium reaching point 31a where the first defect layer 11a was formed by the first helium irradiation 31. In addition, it was confirmed that lattice defects were formed in the first helium passing region 31b overall by the first helium irradiation 31 and that the carrier concentration of a portion away from the first helium reaching point 31a slightly decreased. In the first helium passing region 31b resulting from the first helium irradiation 31, the carrier concentration distribution of a portion 41 away from the first helium reaching point 31a was confirmed to gradually decrease from the wafer rear surface side toward the first helium reaching point 31a. A concentration gradient in a direction from the first helium reaching point 31a toward the wafer rear surface side was $6.23 \times 10^{13}/cm^3$ to $7.27 \times 10^{13}/cm^3$. In the second example, as described hereinafter, the carrier concentration at a portion (the second helium reaching point 34a) of the first helium passing region 31b on the wafer rear surface side significantly decreased due to the second helium irradiation 34. When the second helium irradiation 34 is not performed, the first helium passing region 31b has a carrier concentration distribution that gradually decreases from the wafer rear surface toward the first helium reaching point 31a.

In this manner, for example, it was confirmed that by performing the first helium irradiation 31 to control the carrier lifetime, the carrier concentration of the first helium reaching point 31a may be significantly reduced and in the first helium passing region 31b, the carrier concentration of a portion away from the first helium reaching point 31a may be slightly reduced. Further, it was confirmed that the carrier concentration of a portion 42 deeper than the first helium reaching point 31a from the wafer rear surface was the same as carrier concentration of the silicon wafer (corresponds to the carrier concentration of the n$^-$-type drift layer 1) and was not affected by the first and second helium irradiations 31, 34. At the second helium reaching point 34a where the second defect layer 11b was formed by the second helium irradiation 34, the carrier concentration was also confirmed to significantly decrease. It was confirmed that lattice defects were further formed in the second helium passing region 34b overall by the second helium irradiation 34 and the carrier concentration of a portion away from the second helium reaching point 34a slightly decreased. The carrier concentration of a portion 43 farther on the wafer rear surface side than the second helium reaching point 34a was $5.0 \times 10^{13}/cm^3$.

As described, according to the first embodiment, protons are irradiated from the substrate rear surface and helium is irradiated to a range deeper than that of the proton irradiation whereby the n-type layer containing protons and helium may be formed as the n-type FS layer at a position that from the substrate rear surface, is deeper than the n-type layer containing protons and formed by the proton irradiation. The n-type layer containing protons and helium contacts the n-type layer resulting from the proton irradiation and the substrate front surface side has a carrier concentration distribution that decreases by a more gradual slope than the n-type layer formed by the proton irradiation. In other words, the n-type FS layer may be formed in the n$^-$-type drift layer, at a deep position from the substrate rear surface and having a thickness constituted by the n-type layer containing protons and the n-type layer containing protons and helium.

Further, according to the first embodiment, by forming a thick n-type FS layer reaching a deep position from the substrate rear surface and using proton irradiation to recover lattice defects due to helium irradiation, dV/dt and surge voltage may be suppressed and a current/voltage waveform of a soft recovery may be achieved. Further, according to the first embodiment, an n-type FS layer reaching a deep position from the substrate rear surface may be formed with favorable controllability by proton irradiation and helium irradiation, enabling reliability of the RC-IGBT to be improved. Further, according to the first embodiment, a thick n-type FS layer reaching a deeper position from the substrate rear surface than an irradiation limit (range limit of protons by proton irradiation equipment) of ordinary proton irradiation equipment may be formed by proton irradiation and helium irradiation. Therefore, without a need to use high-cost manufacturing equipment capable of high-acceleration irradiation of protons as compared to ordinary proton irradiation equipment, increases in cost may be prevented.

Figure 8A:
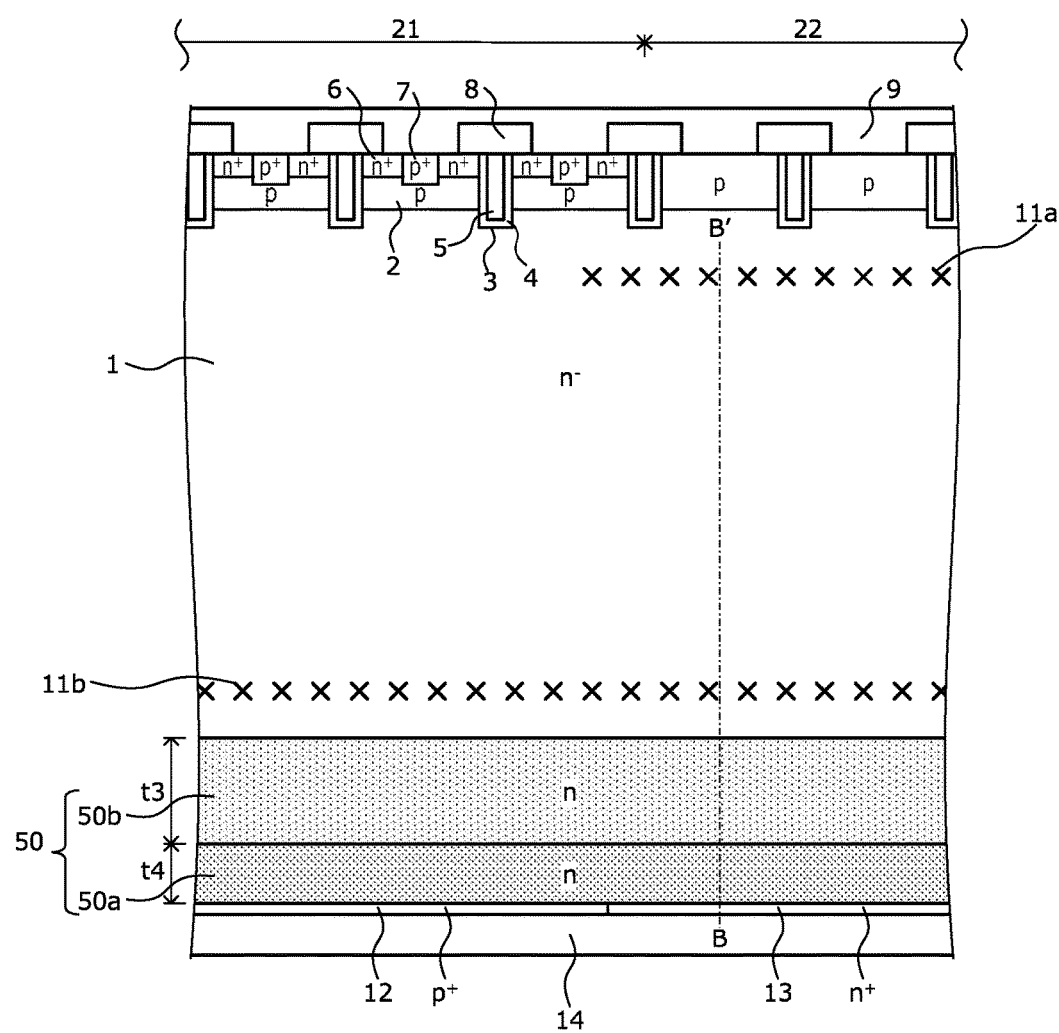
FIG. 8A is a cross-sectional view of a structure of the semiconductor device according to a second embodiment.
Figure 8B:
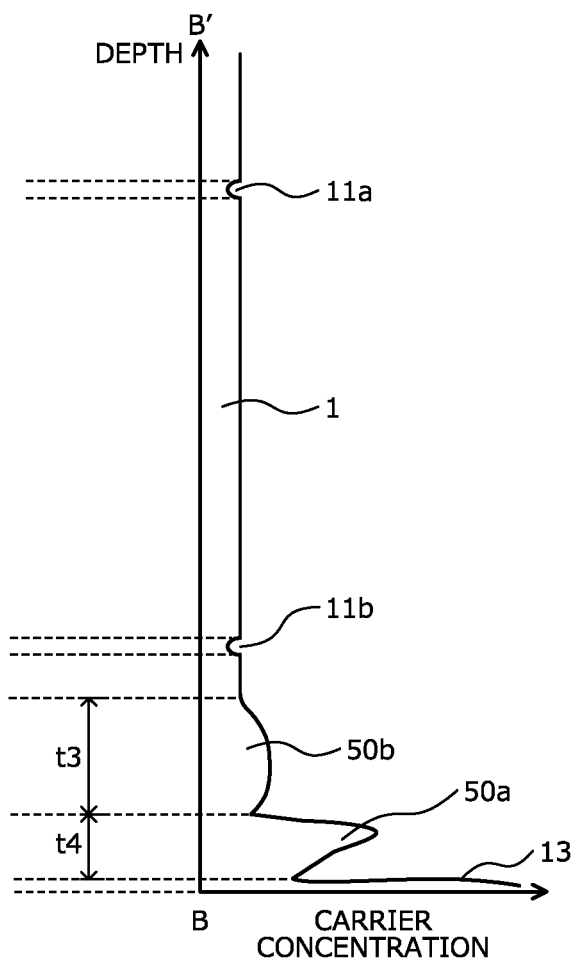
FIG. 8B is a diagram depicting a carrier concentration distribution in a direction of depth from the substrate rear surface along a cutting line B-B' in FIG. 8A.

A structure of the semiconductor device according to a second embodiment is described. FIG. 8A is a cross-sectional view of a structure of the semiconductor device according to the second embodiment. FIG. 8B is a diagram depicting a carrier concentration distribution in a direction of depth from the substrate rear surface along a cutting line B-B' in FIG. 8A. The semiconductor device according to the second embodiment is obtained by applying the first embodiment to a RC-IGBT having a single level of an n-type layer (hereinafter, first n-type layer) 50a formed by proton irradiation. In the second embodiment, an n-type FS layer 50 has the first n-type layer 50a of a single level formed by proton irradiation and an n-type layer (hereinafter, second n-type layer) 50b formed by proton irradiation and helium irradiation.

The first n-type layer 50a is provided at a position near the substrate rear surface in the n$^-$-type drift layer 1, i.e., near the p$^+$-type collector region 12 and the n$^+$-type cathode region 13. The first n-type layer 50a may be formed by conditions identical to those for the n-type layer nearest the substrate rear surface among the plural n-type layers constituting the n-type FS layer in the first embodiment. The second n-type layer 50*b* is a diffusion layer that contains protons and helium and that is formed by proton irradiation for forming the first n-type layer 50*a* and the first helium irradiation 31 (or the second helium irradiation 34, or both). In the formation of the second n-type layer 50*b*, the range (or the second helium irradiation 34, or both) of the first helium irradiation 31 is deeper than the range Rp of the proton irradiation from the substrate rear surface.

The second n-type layer 50*b* is provided at a position deeper than the first n-type layer 50*a* from the substrate rear surface. Further, the second n-type layer 50*b* contacts an anode side of the first n-type layer 50*a* and has a peak carrier concentration at a position deeper than the first n-type layer 50*a* from the substrate rear surface. Further, the second n-type layer 50*b* has a peak carrier concentration that is lower than that of the first n-type layer 50*a* and a carrier concentration distribution that is substantially flat, decreasing by a more gradual slope than the first n-type layer 50*a* from the peak position toward the anode side. A thickness t3 of the second n-type layer 50*b* may be thicker than a thickness t4 of the first n-type layer 50*a* (t3>t4).

The method of manufacturing a semiconductor device according to the second embodiment performs the proton irradiation at step S16 in the method of manufacturing a semiconductor device according to the first embodiment only once (refer to FIG. 2B).

As described, according to the second embodiment, a carrier concentration distribution of the n⁻-type drift layer on the anode side of the n-type FS layer in a vicinity of the n⁺-type cathode region and the p⁺-type collector region may be set to have a gradual impurity concentration distribution over a relatively wide width (thickness) in the depth direction. Therefore, switching characteristics of the RC-IGBT may be adjusted.

Figure 9A:
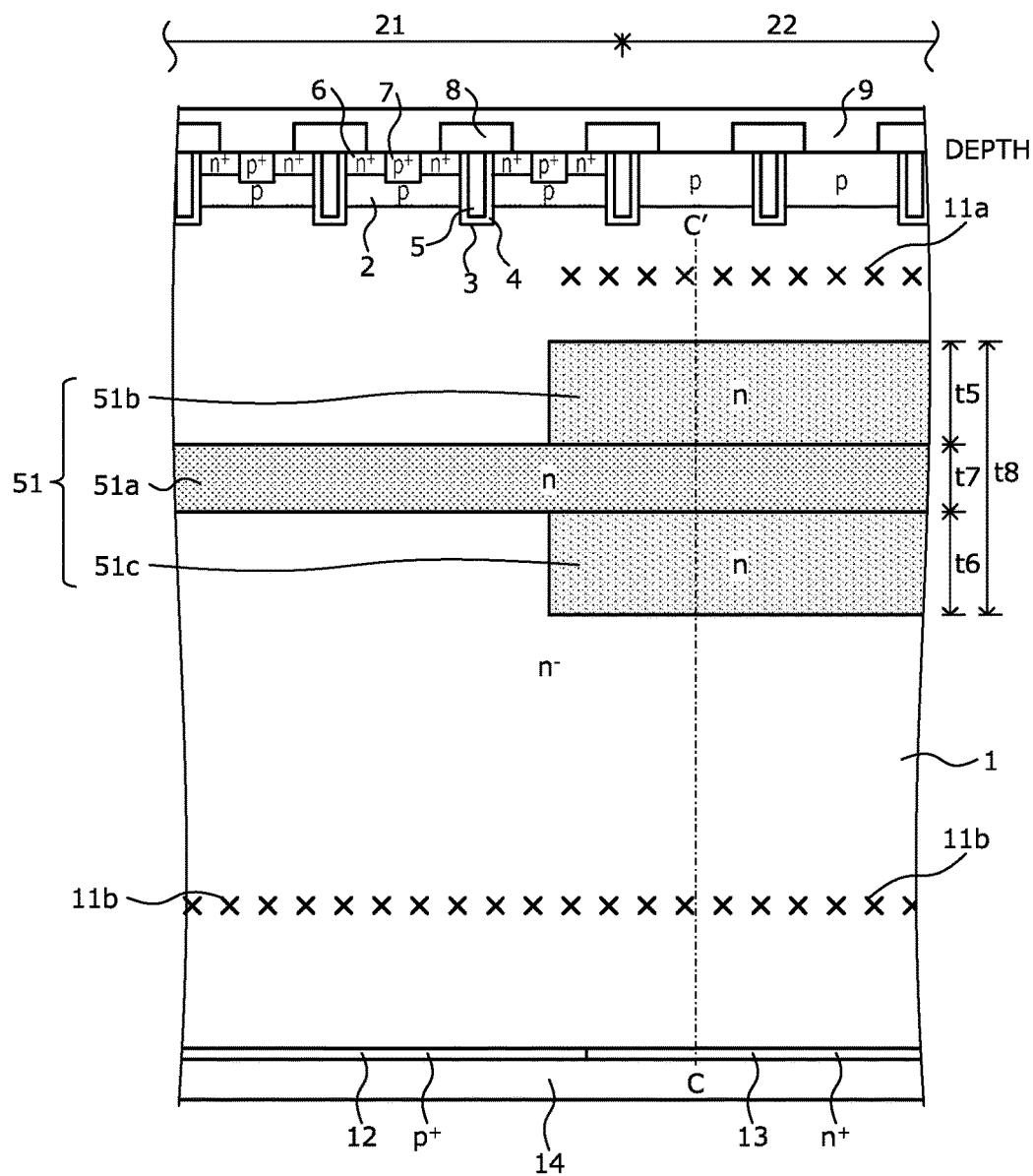
FIG. 9A is a cross-sectional view of a structure of the semiconductor device according to a third embodiment.

A structure of the semiconductor device according to a third embodiment is described. FIG. 9A is a cross-sectional view of a structure of the semiconductor device according to the third embodiment. FIG. 9B is a diagram depicting carrier concentration distribution in the depth direction from the substrate rear surface along cutting line C-C' in FIG. 9A. The semiconductor device according to the third embodiment differs from the semiconductor device according to the second embodiment in that the semiconductor device according to the third embodiment has a broad buffer structure where in the n⁻-type drift layer 1, at a deep predetermined position (for example, a depth of, for example, about 30 μm to 60 μm from the substrate rear surface or a depth of about 60 μm or more) from the substrate rear surface, an n-type FS layer 51 of a single level is provided as a broad buffer layer. A broad buffer structure is a structure that includes a broad buffer layer having a carrier concentration distribution centered about a peak in the depth direction and decreasing from the peak position toward both substrate main surfaces.

In other words, in the third embodiment, the n-type FS layer 51 has a first n-type layer 51*a* formed by proton irradiation, and n-type layers (hereinafter, second and third n-type layers (second and third semiconductor layers)) 51*b*, 51*c* formed by proton irradiation and helium irradiation. In particular, the first n-type layer 51*a* is provided in the IGBT region 21 and the diode region 22, at a deep position from the substrate rear surface in the n⁻-type drift layer 1. The first n-type layer 51*a* is a diffusion layer containing protons and formed by one proton irradiation session. Further, the n-type FS layer 51 has the second and third n-type layers 51*b*, 51*c* on the substrate main surface sides of the first n-type layer 51*a*, respectively. The second and third n-type layers 51*b*, 51*c* are diffusion layers containing protons and helium, and are formed by proton irradiation and the first helium irradiation 31. In other words, regarding the second and third n-type layers 51*b*, 51*c*, the range of the first helium irradiation 31 is provided at a position deeper than the range Rp of the proton irradiation from the substrate rear surface, similar to the first embodiment.

Further, the second and third n-type layers 51*b*, 51*c* are provided in the diode region 22. The second and third n-type layers 51*b*, 51*c* may extend to a vicinity of the boundary of the IGBT region 21 and the diode region 22. The second n-type layer 51*b* contacts the anode side of the first n-type layer 51*a*, and has a peak carrier concentration positioned deeper than the first n-type layer 51*a* from the substrate rear surface. Further, the peak carrier concentration of the second n-type layer 51*b* is lower than that of the first n-type layer 51*a* resulting from proton irradiation and the second n-type layer 51*b* has a substantially flat carrier concentration distribution that decreases by a more gradual slope from the peak position toward the anode side than that of the first n-type layer 51*a*.

The third n-type layer 51*c* contacts the cathode side of the first n-type layer 51 and has a peak carrier concentration at a position shallower than the first n-type layer 51*a* from the substrate rear surface. Further, the peak carrier concentration of the third n-type layer 51*c* is lower than that of the first n-type layer 51*a* resulting from proton irradiation and the third n-type layer 51*c* has a substantially flat carrier concentration distribution that decreases by a more gradual slope from the peak position toward the anode side than that of the first n-type layer 51*a*. Thicknesses t5, t6 of the second and third n-type layers 51*b*, 51*c* may be thicker than a thickness 7t of the first n-type layer 51*a* (t5>t7, t6>t7). Further, the n-type FS layer 51 includes the second and third n-type layers 51*b*, 51*c* whereby a thickness t8 thereof is relatively thick.

The method of manufacturing a semiconductor device according to the third embodiment is implemented by performing in method of manufacturing a semiconductor device according to the second embodiment, the proton irradiation at step S16 using a range Rp deeper from the substrate rear surface than the range Rp in the second embodiment. In the third embodiment, protons that have not been activating in the first n-type layer 51*a* are diffused to both substrate main surface sides of the first n-type layer 51*a* in the diode region 22 by the annealing at step S19. As a result, both substrate main surface sides of the first n-type layer 51*a* have peaks whereby two n-type layers each having a carrier concentration distribution that decreases from the peak toward each of the substrate main surface sides by a slope lower than that of the first n-type layer 51*a* are formed in the diode region 22. These two n-type layers are the second and third n-type layers 51*b*, 51*c*.

Figure 10A:
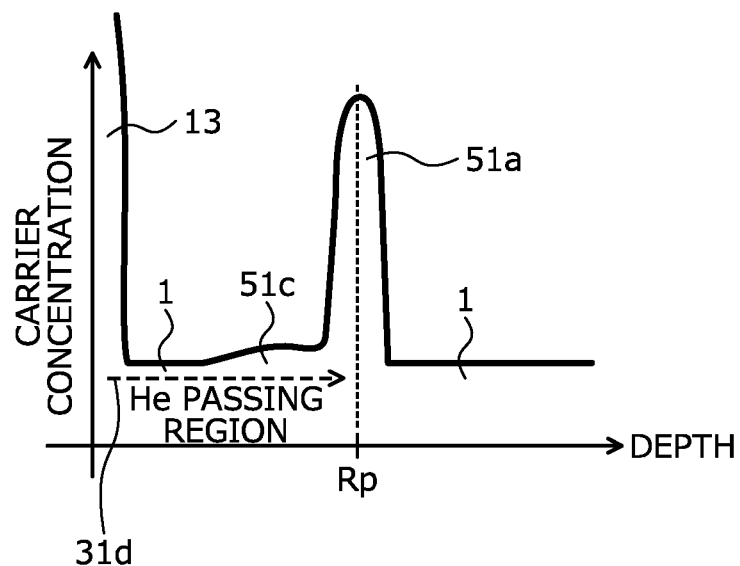
FIGS. 10A and 10B are diagrams of other examples of the carrier concentration distribution of the semiconductor device according to the third embodiment.
Figure 10B:
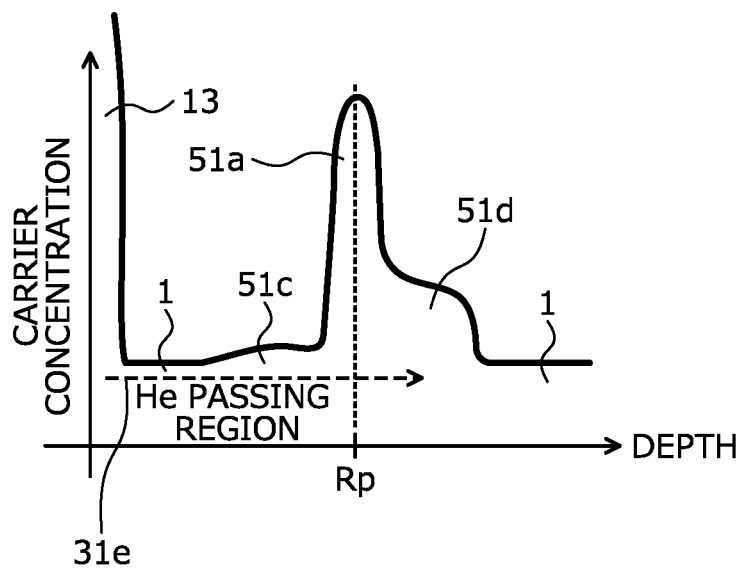

Another example of a structure of the semiconductor device according to the third embodiment is described. FIGS. 10A and 10B are diagram of other examples of the carrier concentration distribution of the semiconductor device according to the third embodiment. In FIGS. 10A and 10B, the defect layer 11*b* is not depicted. FIGS. 10A and 10B depict the carrier concentration distribution from the substrate rear surface in the depth direction, in the diode region 22. In FIGS. 10A and 10B, the horizontal axis is the depth from the substrate rear surface and the vertical axis is the carrier concentration. As depicted in FIG. 10A, the range (the first helium passing region 31*d* resulting from the first helium irradiation 31) of the first helium irradiation 31 may be near a range of the proton irradiation and from the substrate rear surface, may be shallower than the range Rp for the proton irradiation. In this case, the third n-type layer 51c including protons and helium is formed only on the cathode side of the first n-type layer 51a. A configuration of the third n-type layer 51c, for example, is identical to that of the third n-type layer 51c of the semiconductor device according to the third embodiment depicted in FIG. 9.

As depicted in FIG. 10B, the range (the first helium passing region 31e resulting from the first helium irradiation 31) of the first helium irradiation 31 may be near the range RP of the proton irradiation and deeper than the range Rp of the proton irradiation from the substrate rear surface. In this case, protons and helium form second and third n-type layers 51d, 51c on the anode side and the cathode side of the first n-type layer 51a. The second n-type layer 51d on the anode side is positioned within a range of the half width of the peak of the defect layer formed by the first helium irradiation 31 and includes a large amount of lattice defects. Therefore, the second n-type layer 51d has a higher peak carrier concentration than the third n-type layer 51c on the cathode side and a carrier concentration distribution that decreases by a steeper slope than the third n-type layer 51c and by a more gradual slope than the first n-type layer 51a, toward the anode side. A configuration of the third n-type layer 51c, for example, is identical to that of the third n-type layer 51c of the semiconductor device according to the third embodiment depicted in FIG. 9.

As described, according to the third embodiment, effects similar to those of the first embodiment may be obtained. Further, according to the third embodiment, similar to a conventional case, a broad buffer layer may be formed having a first n-type layer resulting from proton irradiation reducing the carrier concentration by a steep slope from the peak position and having second and third n-type layers that contact the first n-type layer and have a carrier concentration that decreases more gradually than the first n-type layer. The semiconductor device having the broad buffer structure obtains a reverse recovery current/voltage waveform of a soft recovery under high-speed operation and is effective in suppressing oscillation of the reverse recovery current/voltage waveform. Therefore, a power semiconductor device implemented by a high-speed, low loss IGBT having soft recovery characteristics, or the like may be provided and is useful for power control equipment.

Further, according to a conventional method proposed as a method of manufacturing a semiconductor device having a broad buffer structure, when a semiconductor substrate is produced by stacking plural semiconductor layers by epitaxial growth, a semiconductor layer that is to constitute a broad buffer layer and has a relatively high phosphorus concentration is formed by epitaxial growth at a deep position from the substrate rear surface (hereinafter, a first conventional example). According to another proposed method, protons irradiated into a semiconductor substrate are converted, by heat treatment, into donors near a depth position of the range Rp from the proton irradiation surface (hereinafter, a second conventional example). In the first conventional example, the cost is higher than in the second conventional example and in the second conventional example, the range of the proton irradiation is the depth position of the broad buffer layer and is dependent on the performance capability of the proton irradiation equipment. In contrast, according to the third embodiment, a thick broad buffer layer reaching a deeper position from the substrate rear surface than an irradiation limit of the proton irradiation equipment may be formed by proton irradiation and helium irradiation. Therefore, the cost is lower than the first conventional example, and a broad buffer layer reaching a deep position from the substrate rear surface is thick and deep compared to the second conventional example.

Figure 11A:
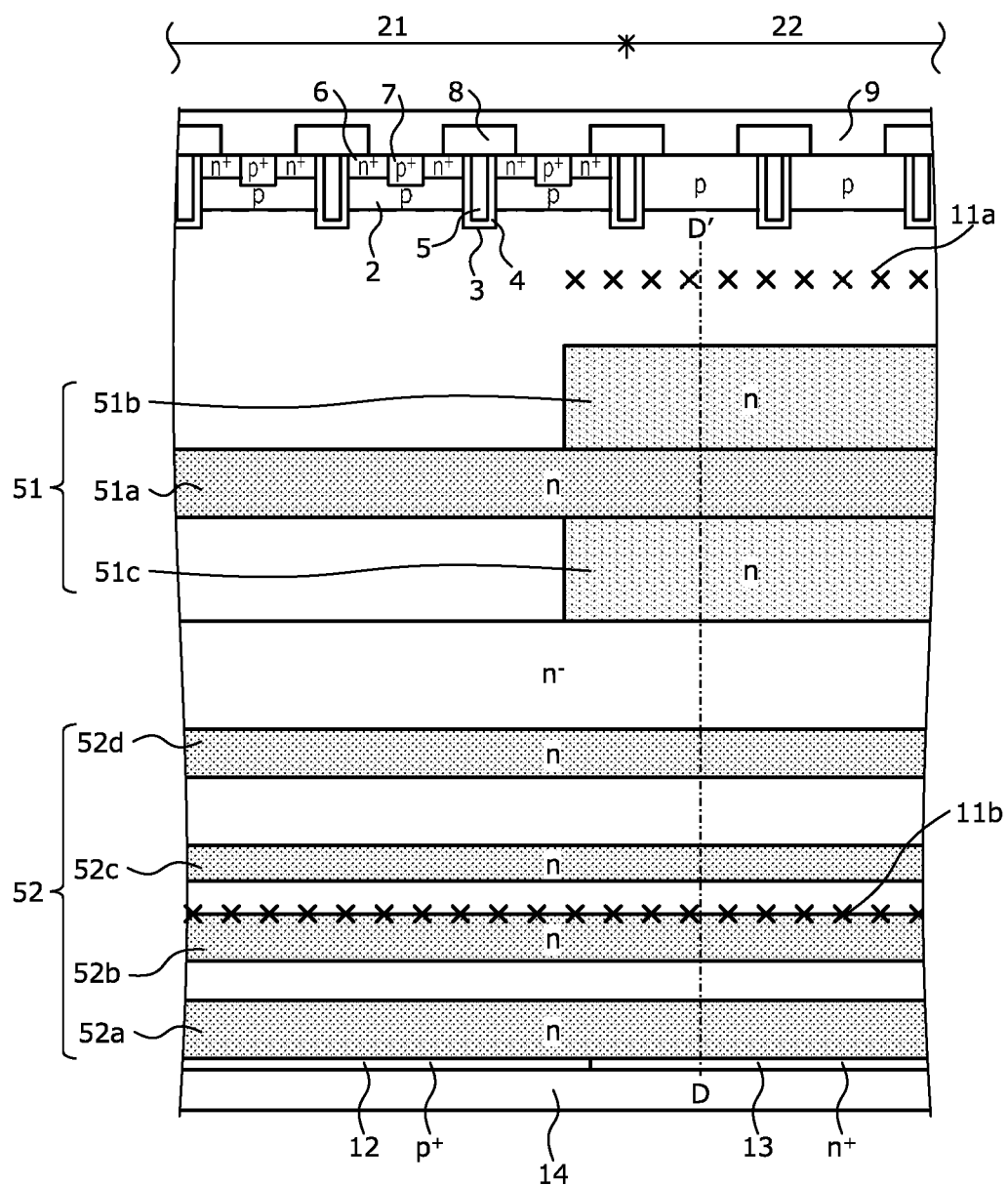
FIG. 11A is a cross-sectional view of a structure of the semiconductor device according to a fourth embodiment.
Figure 11B:
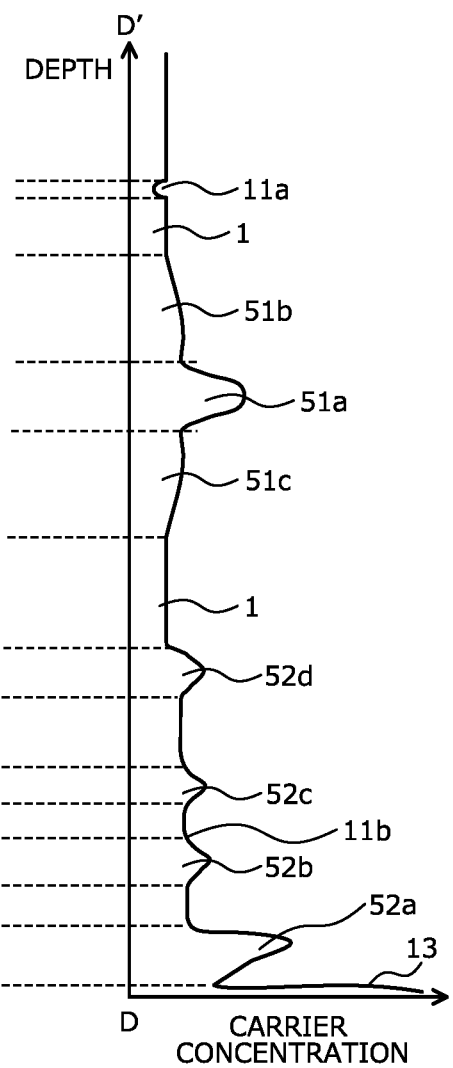
FIG. 11B is a diagram depicting the carrier concentration distribution in the depth direction from the substrate rear surface along cutting line D-D' depicted in FIG. 11A.

A structure of the semiconductor device according to a fourth embodiment is described. FIG. 11A is a cross-sectional view of a structure of the semiconductor device according to the fourth embodiment. FIG. 11B is a diagram depicting the carrier concentration distribution in the depth direction from the substrate rear surface along cutting line D-D' depicted in FIG. 11A. The semiconductor device according to the fourth embodiment differs from the semiconductor device according to the third embodiment in that two n-type FS layers (hereinafter, first and second n-type FS layers) 51, 52 are provided at different depths from the substrate rear surface.

A configuration of the first n-type FS layer 51, for example, is identical to the n-type FS layer of the third embodiment. The second n-type FS layer 52 has n-type layers 52a to 52d of plural levels (here, 4 levels) of differing depths from the substrate rear surface. The plural levels of the n-type layers (hereinafter, the first to fourth n-type layers) 52a to 52d of the second n-type FS layer 52 are diffusion layers formed by plural sessions of proton irradiation of differing ranges Rp. A configuration of the second n-type FS layer 52, for example, may be identical to that of the first to fourth n-type layers formed by proton irradiation, among the plural levels of n-type layers constituting the n-type FS layer of the first embodiment. In FIG. 11, from the first n-type layer 52a nearest the substrate rear surface, reference characters 52a to 52d are appended sequentially in the depth direction from the substrate rear surface in the second n-type FS layer 52.

The method of manufacturing a semiconductor device according to the fourth embodiment is implemented by forming the first n-type layer 51a of the first n-type FS layer 51 by the proton irradiation (first session of proton irradiation) at step S16 and forming the first to fourth n-type layers 52a to 52d of the second n-type FS layer 52 in the method of manufacturing a semiconductor device according to the third embodiment. In FIG. 11, the second defect layer 11b resulting from the second helium irradiation 34 at step S18 is depicted in a state being formed near the second n-type layer 52b (similarly in FIGS. 12 and 14).

As described, according to the fourth embodiment, effects similar to those of the first to third embodiments may be obtained.

Figure 12A:
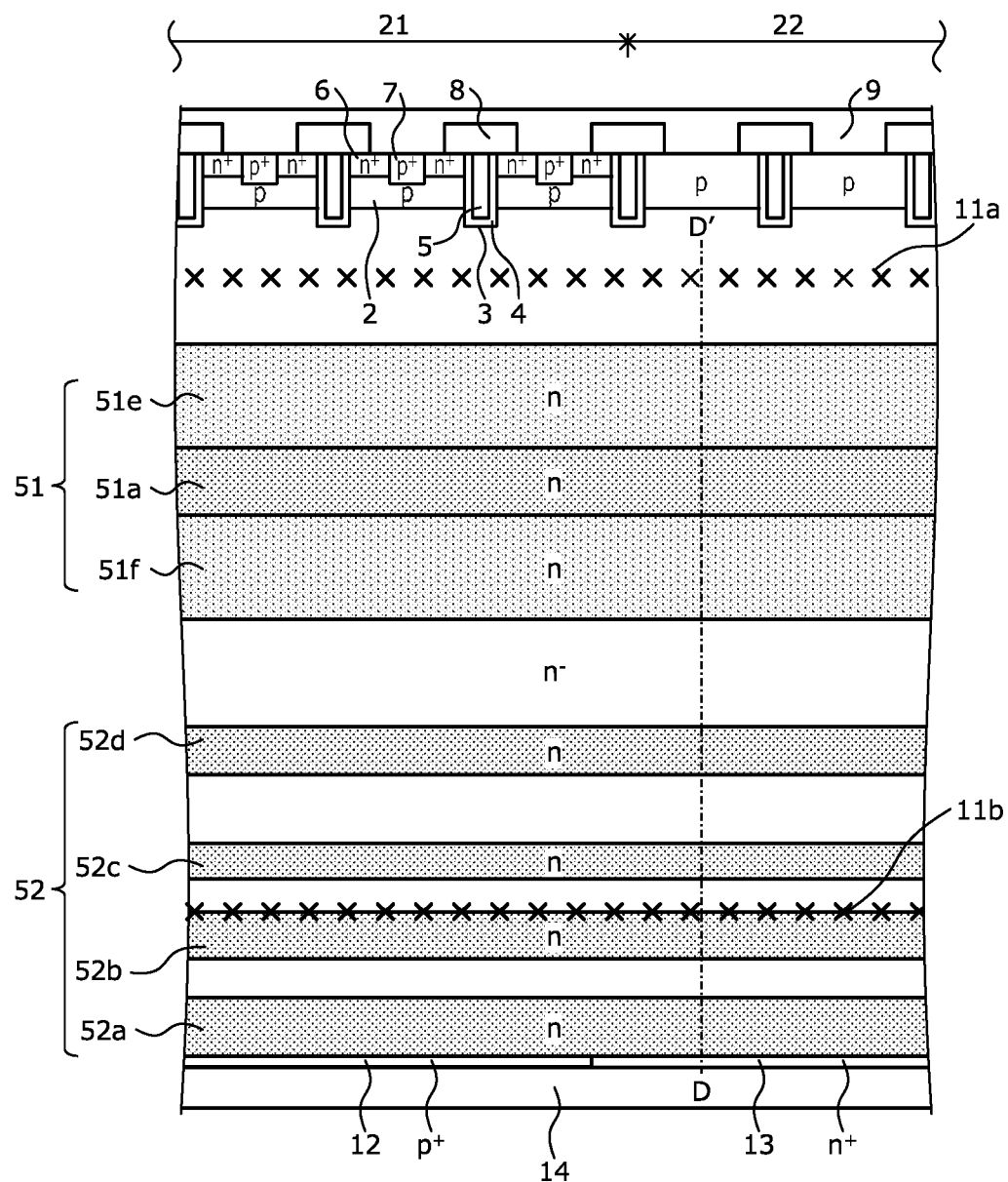
FIG. 12A is a cross-sectional view of a structure of the semiconductor device according to a fifth embodiment.
Figure 14:
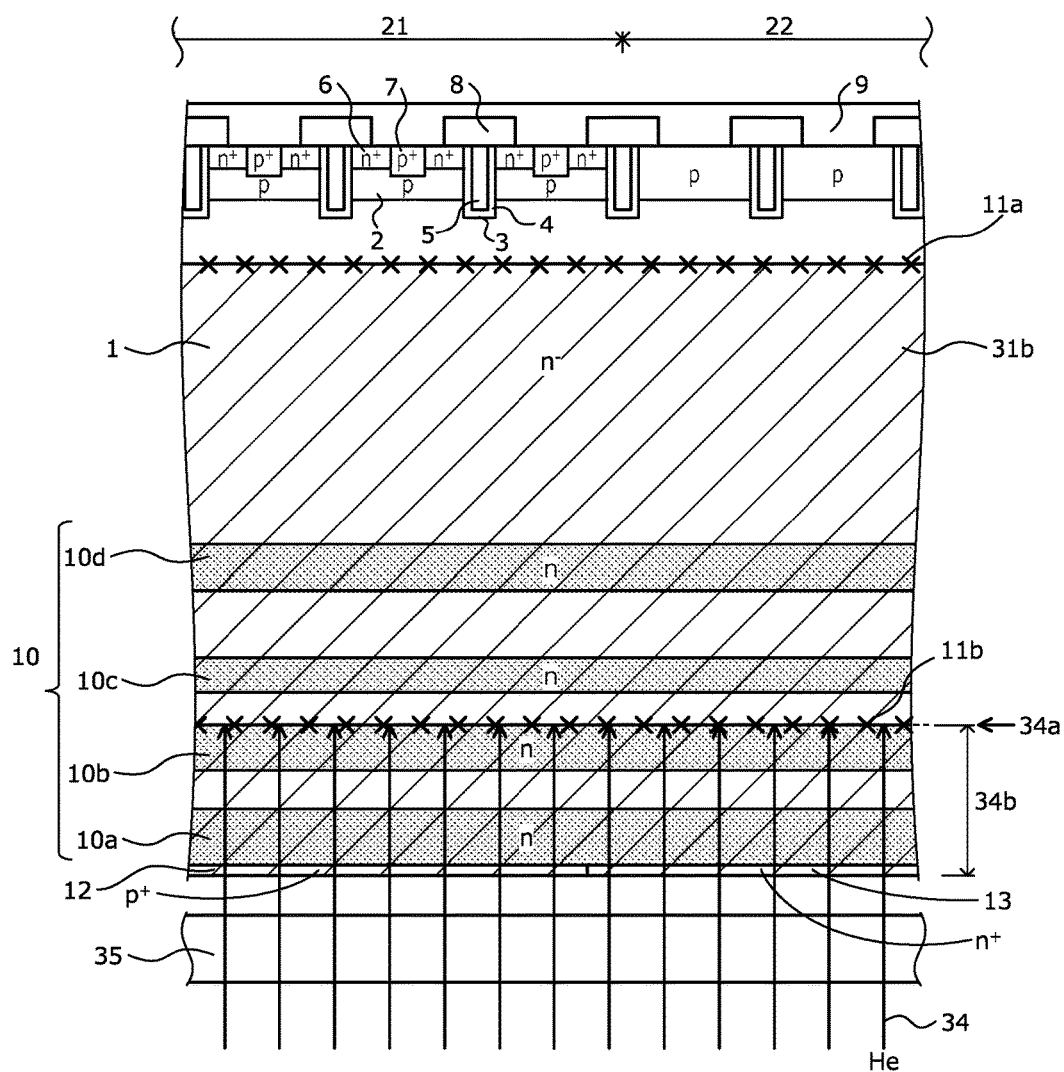

A structure of the semiconductor device according to the fifth embodiment is described. FIG. 12A is a cross-sectional view of a structure of the semiconductor device according to the fifth embodiment. FIG. 12B is a diagram depicting the carrier concentration distribution in the depth direction from the substrate rear surface along cutting line D-D' depicted in FIG. 12A FIGS. 13 and 14 are cross-sectional views of the semiconductor device according to the fifth embodiment during manufacture. The semiconductor device according to the fifth embodiment differs from the semiconductor device according to the fourth embodiment in that the second and third n-type layers (n-type layers resulting from proton irradiation and helium irradiation) 51e, 51f constituting the first n-type FS layer 51 are provided in the IGBT region 21 and the diode region 22. In other words, the first n-type layer (resulting from proton irradiation) 51a of the first n-type FS layer 51 is between the second and third n-type layers 51e, 51f arranged on both substrate surface sides of the first n-type layer 51a. The first defect layer 11a is provided in the IGBT region 21 and the diode region 22.

The method of manufacturing a semiconductor device according to the fifth embodiment is implemented by performing the first helium irradiation 31 at step S18 in the IGBT region 21 and the diode region 22 in the method of manufacturing the semiconductor device according to the fourth embodiment. In other words, as depicted in FIG. 13, in the first helium irradiation 31 at step S18, the thick metal plate (refer to FIG. 3) between the semiconductor substrate and the absorber 32 is not arranged. As a result, as depicted in FIG. 14, the entire IGBT region 21 and the entire diode region 22 become the first helium passing region 31b (portion indicated by diagonal hatching). FIG. 14 depicts a state in which the second helium irradiation 34 is performed at step S18. Therefore, by the annealing at the subsequent step, step S19, on both substrate main surfaces of the first n-type layer 51a, the second and third n-type layers 51e, 51f are formed in the diode region 22 and the IGBT region 21.

The fifth embodiment may be to the first to third embodiments, forming in the IGBT region 21 and the diode region 22, the n-type layers formed by the proton irradiation and helium irradiation in the first to third embodiments.

As described, according to the fifth embodiment, effects similar to those of the first to fourth embodiments may be achieved.

Figure 15:
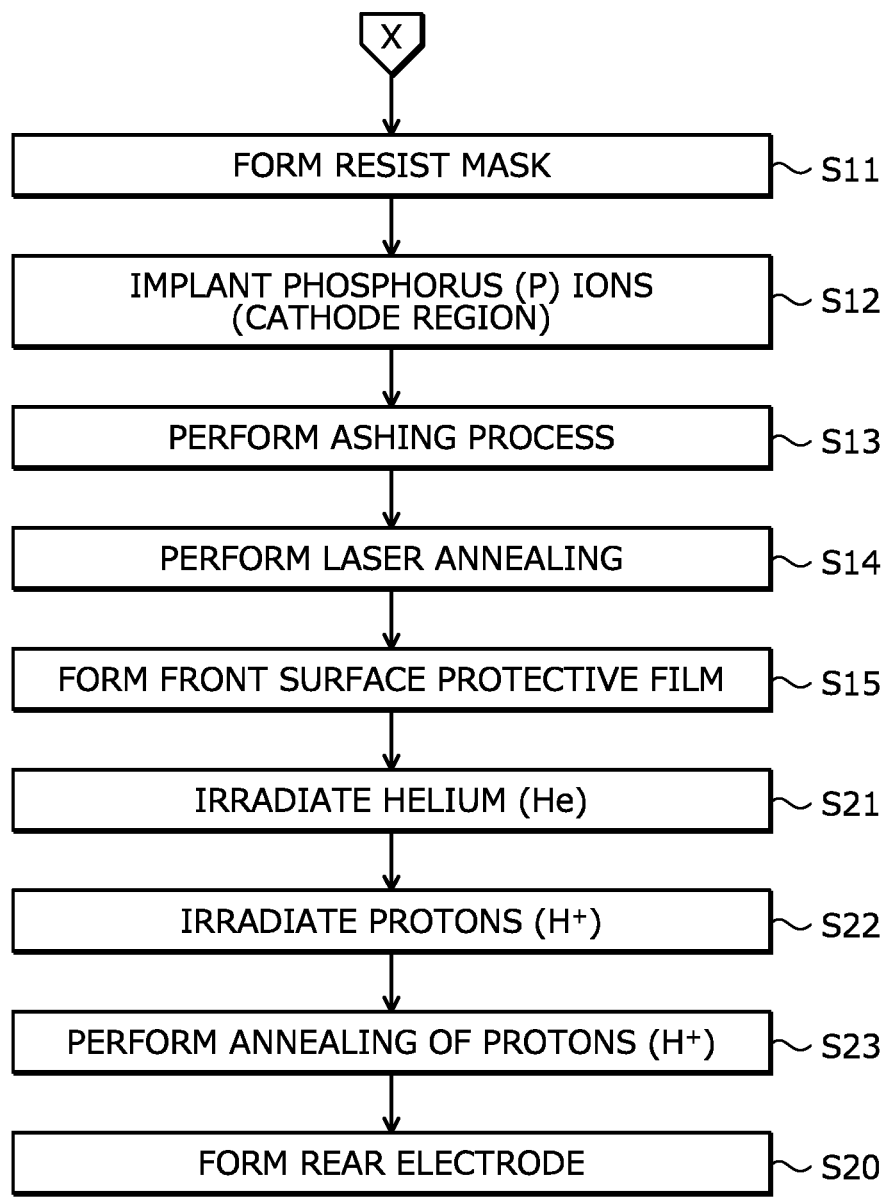
FIG. 15 is a flowchart of the method of manufacturing a semiconductor device according to a sixth embodiment.

The method of manufacturing a semiconductor device according to a sixth embodiment will be described with reference to FIGS. 1, 2A, and 15. FIG. 15 is a flowchart of the method of manufacturing a semiconductor device according to the sixth embodiment. The method of manufacturing a semiconductor device according to the sixth embodiment differs from the method of manufacturing a semiconductor device according to the first embodiment in that the sequence of the proton irradiation and the helium irradiation is interchanged. In other words, the proton irradiation is performed after the helium irradiation.

In particular, as depicted in FIGS. 2A and 15, similar to the first embodiment, processes from the formation of the MOS gate (step S1) to the formation of surface protecting film (step S15) are sequentially performed. Next, the helium irradiation is performed (step S21). The method and conditions of the helium irradiation at step S21 are the same at those of the helium irradiation in the first embodiment. Next, the proton irradiation is performed (step S22). The method and conditions of the proton irradiation at step S22 are the same as those of the proton irradiation in the first embodiment. Next, the protons in the semiconductor substrate are activated by heat treatment (annealing) and the lattice defects resulting from the helium irradiation are recovered (step S23).

In this manner, in the sixth embodiment, after the helium irradiation at step S21 and before the proton irradiation at step S22, the heat treatment for recovering the lattice defects resulting from the helium irradiation is not performed. As a result, the lattice defects bonded to the protons and converted to donors may be prevented from being recovered and eliminated before the proton irradiation step S22, enabling hydrogen donor formation by the proton irradiation similar to the first embodiment. The conditions of the annealing at step S23, for example, are the same as the annealing conditions for activating the protons in the first embodiment. Thereafter, similar to the first embodiment, formation of the rear electrode 14 (step S20) and processes thereafter are sequentially performed whereby the RC-IGBT having a trench gate structure and depicted in FIG. 1 is completed.

The method of manufacturing a semiconductor device according to the sixth embodiment may be used when the semiconductor device according to the second to fifth embodiment is manufactured.

As described, according to the method of manufacturing a semiconductor device according to the sixth embodiment, effects by the structure of the semiconductor device according to the first to fifth embodiments may be achieved.

The present invention is not limited to the described embodiments and various modifications within a scope not departing from the spirit of the invention are possible. For example, in the embodiments, although a RC-IGBT having a trench gate structure is described as an example, for example, the present invention is applicable to various semiconductor devices having an n-type FS layer such as a single IGBT or single diode. Further, in the first and second embodiments, although a case is described in which the first helium irradiation for controlling the carrier lifetime is performed, the first helium irradiation may be performed with an aim to form an n-type layer including protons and helium to become an n-type FS layer.

Nonetheless, when an n-type FS layer is formed by implanting phosphorus or selenium ion by a conventional technique, it is difficult to form the n-type FS layer at a deep position from the wafer rear surface with favorable controllability and suppression of IGBT turn-off vibration and diode reverse recovery vibration is impossible. On the other hand, in the case of proton irradiation, the n-type FS layer may be formed with favorable controllability. However, a problem arises in that the irradiation depth of protons is dependent on the performance capability of the manufacturing equipment and therefore, to form an n-type FS layer reaching a deep position from the wafer rear surface, costly manufacturing equipment capable of proton irradiation with high acceleration is necessary, increasing cost.

According to embodiments of the present invention, protons not activated in the first semiconductor layer are diffused by a second heat treatment process enabling the second semiconductor layer including the diffused protons and helium introduced near the first semiconductor layer by helium irradiation, to be formed contacting the first semiconductor layer. Therefore, for example, a thick semiconductor layer having a thickness constituted by the thicknesses of the first and second semiconductor layers may be formed as a field stop layer or broad buffer layer with favorable controllability irrespective of the performance capability of the proton irradiation equipment.

According to the semiconductor device and the method of manufacturing a semiconductor device of the above embodiments of the present invention, for a semiconductor device having in a drift layer, a semiconductor layer such as a broad buffer layer or a field stop layer of the same conductivity type as that of the drift layer and having a carrier concentration higher than that of the drift, effects may be achieved such as improved reliability of the semiconductor device and reduced cost.

As described, the semiconductor device and the method of manufacturing a semiconductor device according to the above embodiments of the present invention are useful for power semiconductor devices used in power converting equipment such as inverters, and power supply devices such as in various industrial machines.

Although the invention has been described with respect to specific embodiments for a complete and clear disclosure, the appended claims are not to be thus limited but are to be construed as embodying all modifications and alternative constructions that may occur to one skilled in the art which fairly fall within the basic teaching herein set forth.

What is claimed is:

1. A method of manufacturing a semiconductor device, the method comprising:
   irradiating protons from a first main surface of a semiconductor substrate of a first conductivity type using a first predetermined depth as a range, forming a first semiconductor layer of the first conductivity type, the first semiconductor layer containing the protons and having a peak carrier concentration at the first predetermined depth;
   performing a first heat treatment, activating the protons;
   irradiating helium into the semiconductor substrate from the first main surface of the semiconductor substrate using a second predetermined depth that is deeper than the first predetermined depth as the range, thereby introducing lattice defects in the semiconductor substrate; and
   performing a second heat treatment to thereby adjust an amount of the lattice defects in the semiconductor substrate,
   wherein the second heat treatment includes forming a second semiconductor layer of the first conductivity type farther on a second main surface side of the semiconductor substrate than the first semiconductor layer, the second semiconductor layer containing protons and helium and contacting the first semiconductor layer.

2. The method according to claim 1, wherein
   the second heat treatment includes forming the second semiconductor layer having a peak carrier concentration that is lower than that of the first semiconductor layer and having a carrier concentration distribution decreasing toward the second main surface side of the semiconductor substrate, by a more gradual slope than that of the first semiconductor layer.

3. The method according to claim 1, comprising
   forming a second-conductivity-type semiconductor region on the second main surface side of the semiconductor substrate before irradiating the protons, wherein
   the first semiconductor layer and the second semiconductor layer are formed as a field stop layer suppressing a spreading of a depletion layer that spreads from a pn junction between the second-conductivity-type semiconductor region and the semiconductor substrate to the first main surface side of the semiconductor substrate.

4. The method according to claim 1, wherein
   irradiating the protons is performed by a plurality of sessions of differing ranges, thereby forming a plurality of the first semiconductor layers of differing depths from the first main surface of the semiconductor substrate, and
   among the plurality of the first semiconductor layers, the first semiconductor layer formed at a position deepest from the first main surface of the semiconductor substrate is formed by irradiating the protons using the first predetermined depth as the range.

5. The method according to claim 1, wherein
   the second heat treatment includes forming a third semiconductor layer of the first conductivity type farther on the first main surface side of the semiconductor substrate than the first semiconductor layer, the third semiconductor layer contacting the first semiconductor layer and containing the protons and the helium.

6. The method according to claim 5, wherein
   the second heat treatment includes forming the third semiconductor layer having a peak carrier concentration lower than that of the first semiconductor layer and a carrier concentration distribution decreasing toward the first main surface side of the semiconductor substrate by a more gradual slope than that of the first semiconductor layer.

7. A semiconductor device comprising:
   a first semiconductor layer of a first conductivity type provided in a semiconductor substrate of the first conductivity type, the first semiconductor layer containing a hydrogen donor and having a peak carrier concentration at a first predetermined depth from a first main surface side of the semiconductor substrate; and
   a second semiconductor layer of the first conductivity type provided farther on a second main surface side of the semiconductor substrate than the first semiconductor layer, the second semiconductor layer contacting the first semiconductor layer and containing the hydrogen donor and helium,
   wherein a carrier lifetime on the first main surface side is longer than that on the second main surface side of the semiconductor substrate.

8. The semiconductor device according to claim 7, wherein
   the second semiconductor layer has a peak carrier concentration lower than that of the first semiconductor layer and a carrier concentration distribution that decreases toward the second main surface side of the semiconductor substrate by a more gradual slope than that of the first semiconductor layer.

9. The semiconductor device according to claim 7, comprising
   a second-conductivity-type semiconductor region provided on the second main surface side of the semiconductor substrate, wherein
   the first semiconductor layer and the second semiconductor layer constitute a field stop layer that suppresses a spreading of a depletion layer that spreads from a pn junction between the second-conductivity-type semiconductor region and the semiconductor substrate to the first main surface side of the semiconductor substrate.

10. The semiconductor device according to claim 7, comprising
    a plurality of the first semiconductor layers at differing depths from the first main surface of the semiconductor substrate, wherein
    among the plurality of the first semiconductor layers, the first semiconductor layer provided at a position deepest from the first main surface of the semiconductor substrate has a peak carrier concentration at the first predetermined depth.

11. The semiconductor device according to claim 7, comprising
    a third semiconductor layer of the first conductivity type provided farther on the first main surface side of the semiconductor substrate than the first semiconductor layer, the third semiconductor layer contacting the first semiconductor layer and containing the hydrogen donor and the helium.

12. The semiconductor device according to claim 11, wherein
    the third semiconductor layer has a peak carrier concentration lower than that of the first semiconductor layer and a carrier concentration distribution decreasing toward the first main surface side of the semiconductor substrate by a more gradual slope than that of the first semiconductor layer.

13. The semiconductor device according to claim 7, comprising
a defect layer constituted by lattice defects of the helium included at a second predetermined depth deeper than the first predetermined depth from the first main surface of the semiconductor substrate.

14. The semiconductor device according to claim 13, wherein
a carrier concentration of the semiconductor substrate is lower at a portion where the defect layer is provided than at other portions.

* * * * *